United States Patent
Lee

(10) Patent No.: US 10,915,682 B1
(45) Date of Patent: Feb. 9, 2021

(54) REMODELING TESTING METHOD FOR REMODELING TEXT-BASED DISPLAY DESIGN TO THEREBY ACHIEVE GRAPHIC-BASED DISPLAY DESIGN AND DESIGN REMODELING TESTING DEVICE USING THE SAME

(71) Applicant: TMAXSOFT CO., LTD., Seongnam-si (KR)

(72) Inventor: Yeong Ha Lee, Seongnam-si (KR)

(73) Assignee: TMAXSOFT CO., LTD., Seongnam (KR)

( * ) Notice: Subject to any disclaimer, the term of this patent is extended or adjusted under 35 U.S.C. 154(b) by 0 days.

(21) Appl. No.: 16/727,807

(22) Filed: Dec. 26, 2019

(30) Foreign Application Priority Data

Dec. 9, 2019 (KR) .......................... 10-2019-0163125

(51) Int. Cl.
*G06F 30/27* (2020.01)

(52) U.S. Cl.
CPC .................................... *G06F 30/27* (2020.01)

(58) Field of Classification Search
CPC ........................................................ G06F 30/27
See application file for complete search history.

(56) References Cited

U.S. PATENT DOCUMENTS

| | | | | |
|---|---|---|---|---|
| 8,417,715 B1* | 4/2013 | Bruckhaus | ......... | G06Q 30/0202 707/758 |
| 2004/0044516 A1* | 3/2004 | Kennewick | ............. | G10L 15/22 704/5 |
| 2004/0107125 A1* | 6/2004 | Guheen | .................. | G06Q 99/00 705/319 |
| 2004/0163088 A1* | 8/2004 | Frender | ................. | G07F 7/1008 719/313 |
| 2004/0193420 A1* | 9/2004 | Kennewick | ......... | G06F 16/3329 704/257 |
| 2006/0161423 A1* | 7/2006 | Scott | ..................... | G06F 16/353 704/10 |
| 2006/0200767 A1* | 9/2006 | Glaeske | ................. | G06Q 10/10 715/700 |
| 2007/0061722 A1* | 3/2007 | Kronlund | ............. | G06F 3/0481 715/705 |

(Continued)

*Primary Examiner* — Jung-Mu T Chuang
(74) *Attorney, Agent, or Firm* — Xsensus LLP

(57) ABSTRACT

A testing method for design remodeling to remodel a text-based screen design into a graphic-based screen design is provided. The method includes steps of: a design remodeling testing device (a) on condition that a design remodeling learning device has learned a machine-learning module for training so that its parameters have been applied to a machine-learning module for testing of the design remodeling testing device, acquiring screen images for testing from screens for testing from execution of 1-st code for testing; (b) instructing the machine-learning module for testing to generate elemental region information for testing by applying machine-learning operation to the screen images for testing; and (c) retrieving information on candidate design widgets, with which the elemental regions for testing are replaced, from a database, by referring to the outputted elemental region information for testing and providing or supporting another device to provide the information on the candidate design widgets.

20 Claims, 11 Drawing Sheets

(56) References Cited

U.S. PATENT DOCUMENTS

| | | | |
|---|---|---|---|
| 2007/0071206 A1* | 3/2007 | Gainsboro | G10L 25/63 379/168 |
| 2007/0157103 A1* | 7/2007 | Arneson | G06F 3/0488 715/771 |
| 2007/0223699 A1* | 9/2007 | Jones | G06F 16/2477 380/262 |
| 2008/0047004 A1* | 2/2008 | Sibley | G06F 21/34 726/20 |
| 2009/0309808 A1* | 12/2009 | Swingler | G06F 3/1423 345/1.3 |
| 2010/0017487 A1* | 1/2010 | Patinkin | G06Q 10/107 709/206 |
| 2010/0204973 A1* | 8/2010 | Parkinson | G16H 15/00 703/11 |
| 2014/0308630 A1* | 10/2014 | Nash | G06F 40/40 434/157 |
| 2015/0052075 A1* | 2/2015 | Jayadevan | G06Q 10/10 705/327 |
| 2016/0162286 A1* | 6/2016 | Bankole | G06F 8/65 717/170 |
| 2018/0349153 A1* | 12/2018 | Brillante | G06F 8/38 |

* cited by examiner

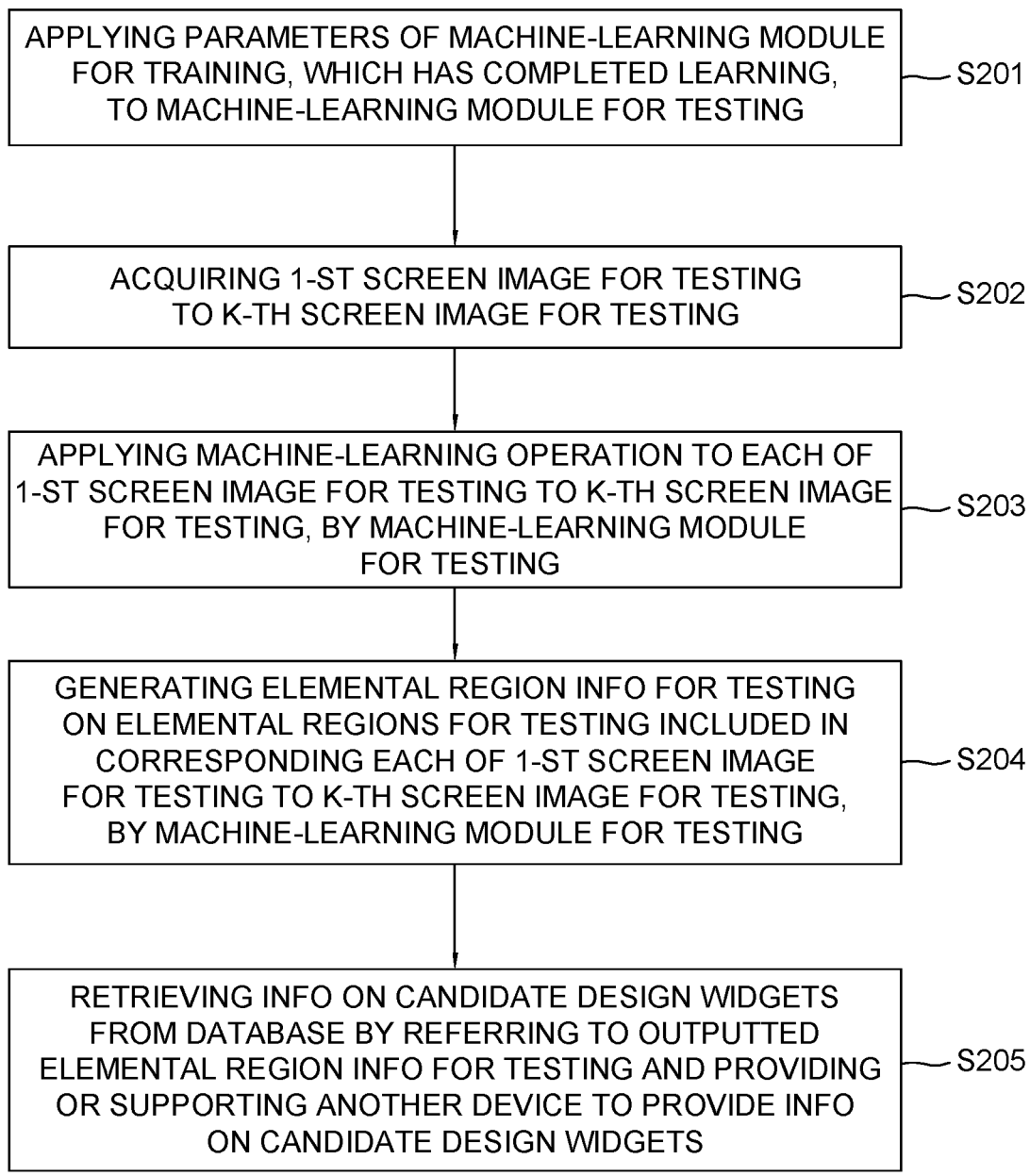

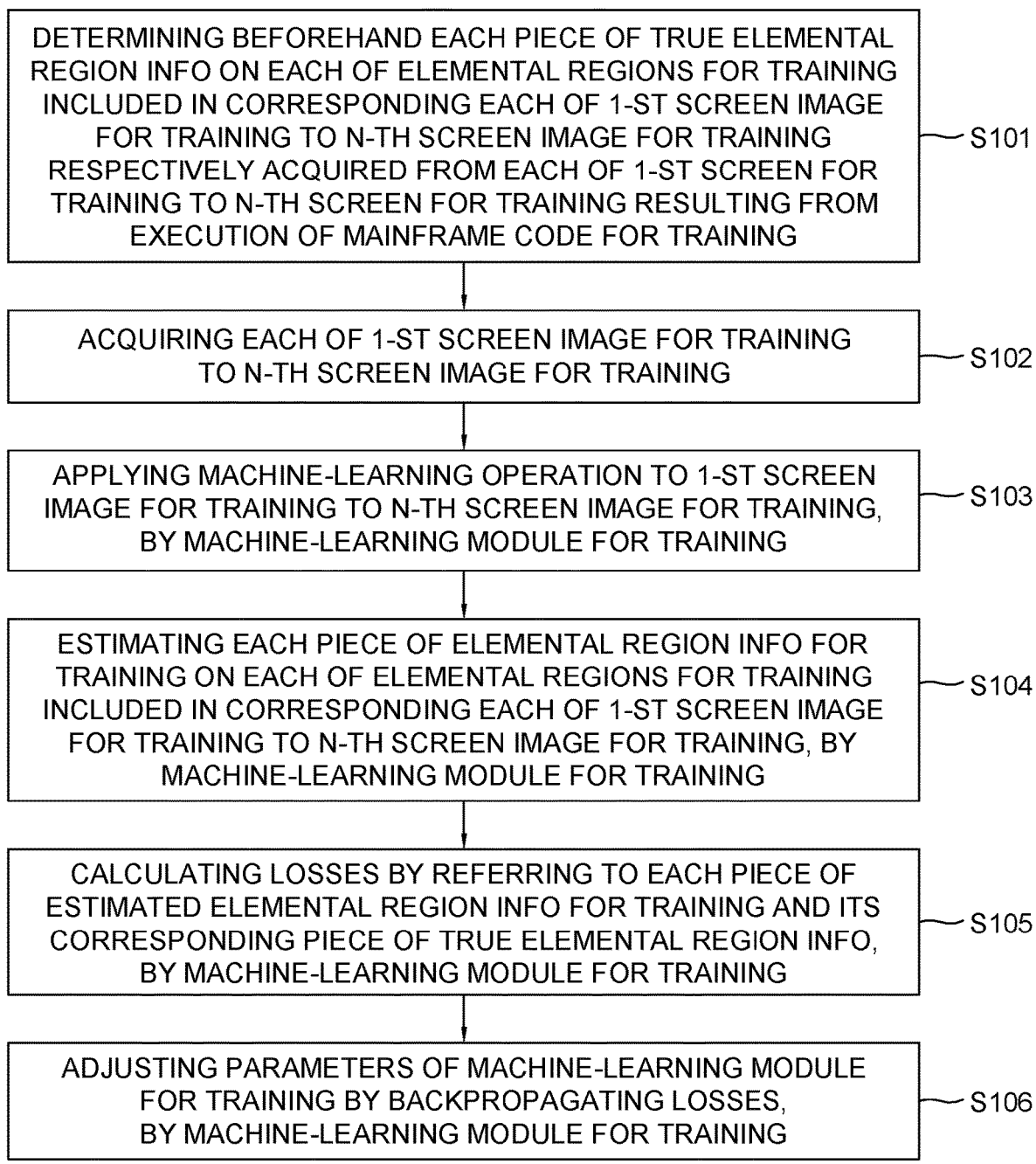

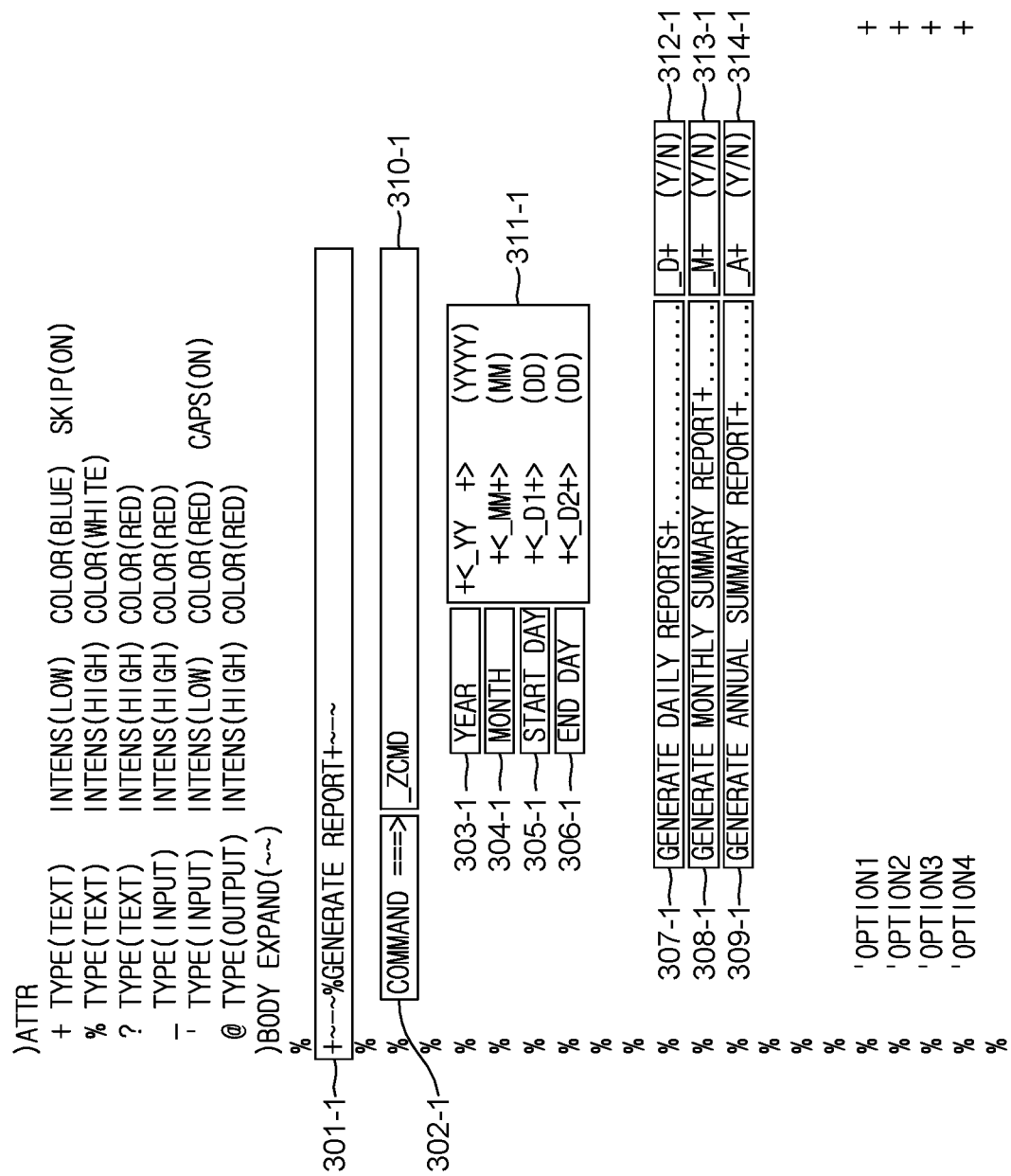

------------------------------ GENERATE REPORT ------------------------------

COMMAND ===> SUBMIT

YEAR          < 2019 >    (YYYY)
              MONTH         < 03 >      (MM)
              START DAY     < 22 >      (DD)
              END DAY       < 25 >      (DD)

GENERATE DAILY REPORTS+.................Y      (Y/N)
       GENERATE MONTHLY SUMMARY REPORT+.......N      (Y/N)
       GENERATE ANNUAL SUMMARY REPORT+........N      (Y/N)
```

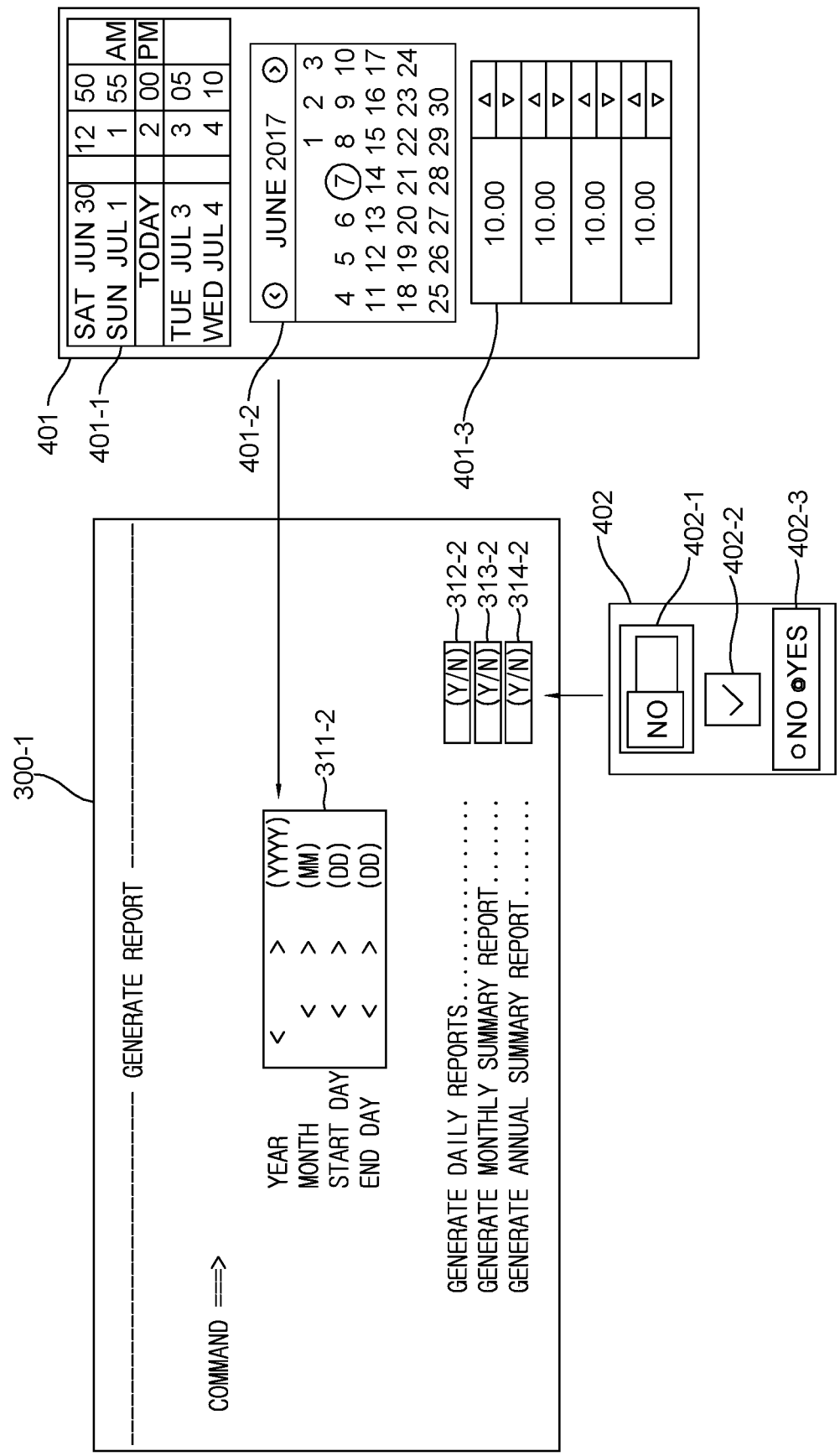

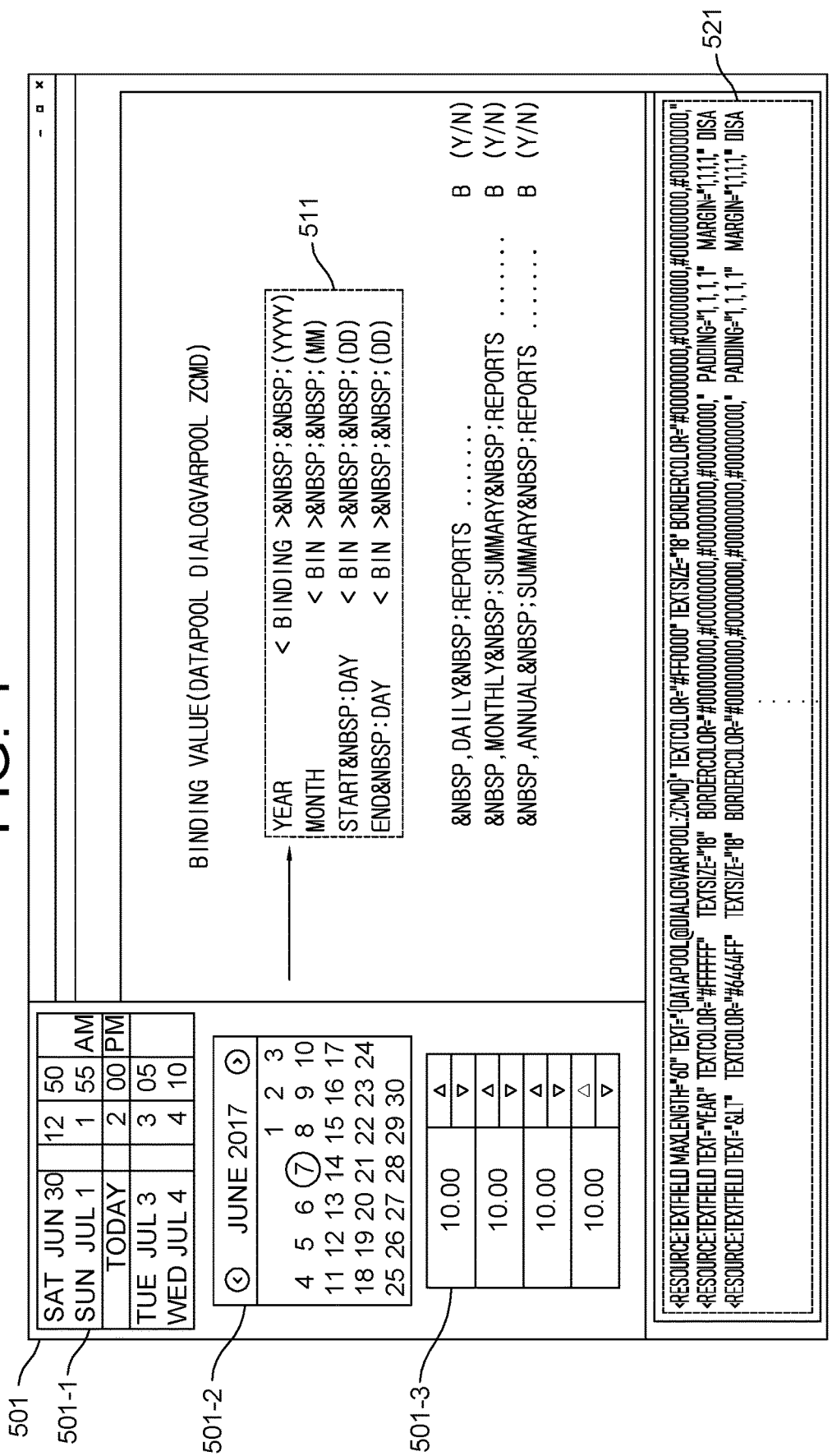

REMODELING TESTING METHOD FOR
REMODELING TEXT-BASED DISPLAY
DESIGN TO THEREBY ACHIEVE
GRAPHIC-BASED DISPLAY DESIGN AND
DESIGN REMODELING TESTING DEVICE
USING THE SAME

CROSS REFERENCE TO RELATED
APPLICATION

This application claims the benefit of foreign priority to Korean Application 10-2019-0163125 filed Dec. 9, 2019, the entire contents of which being incorporated herein by reference.

FIELD OF THE DISCLOSURE

The present disclosure relates to a method for remodeling a text-based screen design into a graphic-based screen design; and more particularly, to a design remodeling test method and a design remodeling testing device using the same.

BACKGROUND OF THE DISCLOSURE

In a design of a screen provided to a user in a computing system, it is common to spend a lot of time and money to change the design of the screen to provide a new user experience.

For example, in case of a mainframe computer, the design of the screen provided to the user is text-based, which provides only a change of layout or coloring of text, posing a limit on providing convenience and diversity of the design to the user.

In addition, recently, a mainframe system is being re-hosted to a new open system. In this re-hosting process, text-based code for screen design of the mainframe system may also be migrated to the new open system. However, although graphic-based screen design is provided in the new open system, there is a problem in that it is difficult to provide a graphic-based user experience because only monotonous migration is performed due to the aforementioned problems of time and cost.

The U.S. Laid-Open Publication No. 2018-0349153 discloses, in a software program of a computing system, during a process of migrating a previous interface including a previous screen design to a new interface including a new screen design, a method of simulating a specific task of the previous interface to provide a tutorial for the specific task in the new interface, however, details of how to convert an old screen design into a new screen design are not disclosed.

Therefore, there is still a need for a method of efficiently changing a text-based screen design such as in the mainframe system to a graphic-based screen design.

SUMMARY OF THE DISCLOSURE

It is an object of the present disclosure to solve all the aforementioned problems.

It is another object of the present disclosure to provide a learning method and a testing method based on machine learning by referring to code for screen design, to thereby accurately determine elemental regions to be used for remodeling a text-based screen design into a graphic-based screen design, and provide information on candidate design widgets that can replace the elemental regions to be remodeled.

It is still another object of the present disclosure to provide the learning method and the testing method based on the machine learning by further referring to images whose regions corresponding to the code for screen design are distinguishable via colors per each of categories or per each of associated meanings of the code for screen design as a result of code analysis or natural language processing (NLP) on the code for screen design, to thereby allow accurate determination of the elemental regions in the text-based screen design that can be replaced with graphic-based screen design.

It is still yet another object of the present disclosure to provide a method for referring to variables mapping information generated beforehand during a process of remodeling the text-based screen design into the graphic-based screen design, to thereby provide information on the candidate design widgets efficiently.

In accordance with one aspect of the present disclosure, there is provided a testing method for design remodeling to remodel a text-based screen design into a graphic-based screen design, including steps of: (a) on condition that a design remodeling learning device has learned a machine-learning module for training so that one or more parameters of the machine-learning module for training have been applied to a machine-learning module for testing of a design remodeling testing device, the design remodeling testing device performing a process of acquiring each of a 1-st screen image for testing to a k-th screen image for testing from each of a 1-st screen for testing to a k-th screen for testing, respectively, wherein the 1-st screen for testing to the k-th screen for testing are screens resulting from execution of 1-st code for testing to be remodeled and k is an integer larger than 0; (b) the design remodeling testing device performing a process of instructing the machine-learning module for testing to generate each piece of elemental region information for testing including coordinates information for testing, elemental region size information for testing, and category information on each of one or more elemental regions for testing by applying at least one machine-learning operation to the 1-st screen image for testing to the k-th screen image for testing wherein at least part of the elemental regions for testing is included in corresponding each of the 1-st screen image for testing to the k-th screen image for testing; and (c) the design remodeling testing device performing (i) a process of retrieving information on one or more candidate design widgets, with which each of the elemental regions for testing is replaced, from a database, by referring to the outputted elemental region information for testing wherein the database stores information on the candidate design widgets per each of categories and (ii) a process of providing or supporting another device to provide the information on the candidate design widgets.

As one example, the machine-learning module for training is learned by the design remodeling learning device, and wherein the design remodeling learning device performs (i) on condition that each piece of true elemental region information has been determined including true coordinates information, true elemental region size information, and true category information on each of one or more elemental regions for training, wherein at least part of the elemental regions for training is included in corresponding each of a 1-st screen image for training to an n-th screen image for training acquired from each of a 1-st screen for training to an n-th screen for training, respectively, and wherein the 1-st screen for training to the n-th screen for training are screens resulting from execution of 1-st code for training and n is an integer larger than 0, a process of acquiring each of the 1-st screen image for training to the n-th screen image for training, and a process of instructing the machine-learning module for training to apply the machine-learning operation to each of the 1-st screen image for training to the n-th screen image for training, to thereby estimate each piece of elemental region information for training including coordinates information for training, elemental region size information for training, and the category information on each of the elemental regions for training, and (ii) a process of instructing the machine-learning module for training to calculate one or more losses by referring to each piece of the estimated elemental region information for training and its corresponding piece of true elemental region information, and adjusting the parameters of the machine-learning module for training by backpropagating the losses.

As one example, the 1-st code for testing is mainframe code for testing and the 1-st code for training is mainframe code for training, wherein, during a process of learning the machine-learning module for training, the design remodeling learning device performs a process of instructing the machine-learning module for training to estimate each piece of the elemental region information for training including the coordinates information for training, the elemental region size information for training, and the category information on each of the elemental regions for training by further referring to the mainframe code for training, and wherein the design remodeling testing device performs a process of instructing the machine-learning module for testing to output each piece of the elemental region information for testing including the coordinates information for testing, the elemental region size information for testing, and the category information on each of the elemental regions for testing by further referring to the mainframe code for testing.

As one example, information on the candidate design widgets stored in the database further includes information on each piece of 2-nd code for testing corresponding to each of the candidate design widgets, and wherein the method further comprises a step of: (d) if selection information is acquired representing that a developer selects one of the candidate design widgets provided for a specific elemental region for testing among the elemental regions for testing, the design remodeling testing device performing a process of replacing (i) each piece of specific partial mainframe code for testing, corresponding to the specific elemental region for testing, among the mainframe code for testing with (ii) the 2-nd code for testing corresponding to the selected one of the candidate design widgets.

As one example, on condition that variables mapping information on at least part of mapping relation of one or more variables between the mainframe code for testing and the 2-nd code for testing corresponding to the candidate design widgets has been generated beforehand by referring to 1-st variable information on each of one or more variables used in the mainframe code for testing and 2-nd variable information on each of one or more variables used in each of the candidate design widgets, the design remodeling testing device performs a process of replacing (i) each piece of specific partial mainframe code for testing, corresponding to the specific elemental region for testing, among the mainframe code for testing with (ii) the 2-nd code for testing corresponding to the selected one of the candidate design widgets, by further referring to the variables mapping information.

As one example, on condition that (i) prior analysis of the mainframe code for training has been completed, (ii) each of at least one piece of partial mainframe code for training per each of the categories, corresponding to each of functions to be implemented on a screen if its corresponding piece of the mainframe code for training is executed, has been classified as a result of the prior analysis, and (iii) at least one code-function image for training has been further generated beforehand by distinguishing one or more regions, corresponding to each classified piece of the partial mainframe code for training per each of the categories, by each of colors per each of the categories for each of the 1-st screen image for training to the n-th screen image for training, the design remodeling learning device performs a process of instructing the machine-learning module for training to estimate each piece of the elemental region information for training by further referring to the code-function image for training, and wherein, on condition that (i) preceding analysis of the mainframe code for testing has been completed, (ii) each of at least one piece of partial mainframe code for testing per each of the categories, corresponding to each of functions to be implemented on a screen if its corresponding piece of the mainframe code for testing is executed, has been classified as a result of the preceding analysis, and (iii) at least one code-function image for testing has been further generated beforehand by distinguishing one or more regions, corresponding to each classified piece of the partial mainframe code for testing per each of the categories, by each of the colors per each of the categories for each of the 1-st screen image for testing to the k-th screen image for testing, the design remodeling testing device performs a process of instructing the machine-learning module for testing to output each piece of the elemental region information for testing by further referring to the code-function image for testing.

As one example, on condition that (i) natural language processing (NLP) has been performed on the mainframe code for training, (ii) each piece of partial mainframe code for training per each associated meaning has been identified, which has its corresponding associated meaning, among the mainframe code for training as a result of the NLP, and (iii) at least one NLP image for training has been further generated beforehand by distinguishing one or more regions, corresponding to each classified piece of the partial mainframe code for training per each of the associated meanings, by each of the colors per each of the associated meanings for each of the 1-st screen image for training to the n-th screen image for training, the design remodeling learning device performs a process of instructing the machine-learning module for training to estimate each piece of the elemental region information for training by further referring to the NLP image for training, wherein, on condition that (i) the NLP has been performed on the mainframe code for testing, (ii) each piece of partial mainframe code for testing per each of the associated meanings has been identified, which has its corresponding associated meaning, among the mainframe code for testing as a result of the NLP, and (iii) at least one NLP image for testing has been further generated beforehand by distinguishing one or more regions, corresponding to each classified piece of the partial mainframe code for testing per each of the associated meanings, by each of the colors per each of the associated meanings for each of the 1-st screen image for testing to the k-th screen image for testing, the design remodeling testing device performs a process of instructing the machine-learning module for testing to output each piece of the elemental region information for testing by further referring to the NLP image for testing.

As one example, the design remodeling learning device performs a process of instructing the machine-learning module for training to estimate each of probabilities of each piece of the elemental region information for training for each of the 1-st screen image for training to the n-th screen image for training belonging to each of the categories, and wherein the design remodeling testing device performs a process of instructing the machine-learning module for testing to output each of probabilities of each piece of the elemental region information for testing for each of the 1-st screen image for testing to the k-th screen image for testing belonging to each of the categories.

As one example, the design remodeling learning device performs a process of determining each specific category corresponding to each highest probability among each of the probabilities of each of the elemental regions for training as each of the categories of each of the elemental regions for training, and wherein the design remodeling testing device performs a process of determining each specific category corresponding to each highest probability among each of the probabilities of each of the categories for each piece of the elemental regions for testing as each of the categories of each of the elemental regions for testing.

As one example, each of the elemental regions for training is classified into sub-categories, wherein the true category information included in the true elemental region information has each of the sub-categories corresponding to each of the elemental regions for training, wherein, during the process of learning the machine-learning module for training, the design remodeling learning device instructs the machine-learning module for training to estimate each of the probabilities of each of the elemental regions for training belonging to each of the sub-categories, wherein the category information corresponding to each of the elemental regions for testing is classified into the sub-categories, and wherein the design remodeling testing device performs a process of instructing the machine-learning module for testing to output each of probabilities of each of the elemental regions for testing belonging to each of the sub-categories.

In accordance with another aspect of the present disclosure, there is provided a design remodeling testing device for design remodeling to remodel a text-based screen design into a graphic-based screen design, including: at least one memory that stores instructions; and at least one processor configured to execute the instructions to perform or support another device to perform: (I) on condition that a design remodeling learning device has learned a machine-learning module for training so that one or more parameters of the machine-learning module for training have been applied to a machine-learning module for testing of the design remodeling testing device, a process of acquiring each of a 1-st screen image for testing to a k-th screen image for testing from each of a 1-st screen for testing to a k-th screen for testing, respectively, wherein the 1-st screen for testing to the k-th screen for testing are screens resulting from execution of 1-st code for testing to be remodeled and k is an integer larger than 0, (II) a process of instructing the machine-learning module for testing to generate each piece of elemental region information for testing including coordinates information for testing, elemental region size information for testing, and category information on each of one or more elemental regions for testing by applying at least one machine-learning operation to the 1-st screen image for testing to the k-th screen image for testing wherein at least part of the elemental regions for testing is included in corresponding each of the 1-st screen image for testing to the k-th screen image for testing, and (III) (III-1) a process of retrieving information on one or more candidate design widgets, with which each of the elemental regions for testing is replaced, from a database, by referring to the outputted elemental region information for testing wherein the database stores information on the candidate design widgets per each of categories and (III-2) a process of providing or supporting another device to provide the information on the candidate design widgets.

As one example, the machine-learning module for training is learned by the design remodeling learning device, and wherein the design remodeling learning device performs (i) on condition that each piece of true elemental region information has been determined including true coordinates information, true elemental region size information, and true category information on each of one or more elemental regions for training, wherein at least part of the elemental regions for training is included in corresponding each of a 1-st screen image for training to an n-th screen image for training acquired from each of a 1-st screen for training to an n-th screen for training, respectively, and wherein the 1-st screen for training to the n-th screen for training are screens resulting from execution of 1-st code for training and n is an integer larger than 0, a process of acquiring each of the 1-st screen image for training to the n-th screen image for training, and a process of instructing the machine-learning module for training to apply the machine-learning operation to each of the 1-st screen image for training to the n-th screen image for training, to thereby estimate each piece of elemental region information for training including coordinates information for training, elemental region size information for training, and the category information on each of the elemental regions for training, and (ii) a process of instructing the machine-learning module for training to calculate one or more losses by referring to each piece of the estimated elemental region information for training and its corresponding piece of true elemental region information, and adjusting the parameters of the machine-learning module for training by backpropagating the losses.

As one example, the 1-st code for testing is mainframe code for testing and the 1-st code for training is mainframe code for training, wherein, during a process of learning the machine-learning module for training, the design remodeling learning device performs a process of instructing the machine-learning module for training to estimate each piece of the elemental region information for training including the coordinates information for training, the elemental region size information for training, and the category information on each of the elemental regions for training by further referring to the mainframe code for training, and wherein the processor performs a process of instructing the machine-learning module for testing to output each piece of the elemental region information for testing including the coordinates information for testing, the elemental region size information for testing, and the category information on each of the elemental regions for testing by further referring to the mainframe code for testing.

As one example, information on the candidate design widgets stored in the database further includes information on each piece of 2-nd code for testing corresponding to each of the candidate design widgets, and wherein the processor further performs: (IV) if selection information is acquired representing that a developer selects one of the candidate design widgets provided for a specific elemental region for testing among the elemental regions for testing, a process of replacing (IV-1) each piece of specific partial mainframe code for testing, corresponding to the specific elemental region for testing, among the mainframe code for testing with (IV-2) the 2-nd code for testing corresponding to the selected one of the candidate design widgets.

As one example, on condition that variables mapping information on at least part of mapping relation of one or more variables between the mainframe code for testing and the 2-nd code for testing corresponding to the candidate design widgets has been generated beforehand by referring to 1-st variable information on each of one or more variables used in the mainframe code for testing and 2-nd variable information on each of one or more variables used in each of the candidate design widgets, the processor performs a process of replacing (i) each piece of specific partial mainframe code for testing, corresponding to the specific elemental region for testing, among the mainframe code for testing with (ii) the 2-nd code for testing corresponding to the selected one of the candidate design widgets, by further referring to the variables mapping information.

As one example, on condition that (i) prior analysis of the mainframe code for training has been completed, (ii) each of at least one piece of partial mainframe code for training per each of the categories, corresponding to each of functions to be implemented on a screen if its corresponding piece of the mainframe code for training is executed, has been classified as a result of the prior analysis, and (iii) at least one code-function image for training has been further generated beforehand by distinguishing one or more regions, corresponding to each classified piece of the partial mainframe code for training per each of the categories, by each of colors per each of the categories for each of the 1-st screen image for training to the n-th screen image for training, the design remodeling learning device performs a process of instructing the machine-learning module for training to estimate each piece of the elemental region information for training by further referring to the code-function image for training, and wherein, on condition that (i) preceding analysis of the mainframe code for testing has been completed, (ii) each of at least one piece of partial mainframe code for testing per each of the categories, corresponding to each of functions to be implemented on a screen if its corresponding piece of the mainframe code for testing is executed, has been classified as a result of the preceding analysis, and (iii) at least one code-function image for testing has been further generated beforehand by distinguishing one or more regions, corresponding to each classified piece of the partial mainframe code for testing per each of the categories, by each of the colors per each of the categories for each of the 1-st screen image for testing to the k-th screen image for testing, the processor performs a process of instructing the machine-learning module for testing to output each piece of the elemental region information for testing by further referring to the code-function image for testing.

As one example, on condition that (i) natural language processing (NLP) has been performed on the mainframe code for training, (ii) each piece of partial mainframe code for training per each associated meaning has been identified, which has its corresponding associated meaning, among the mainframe code for training as a result of the NLP, and (iii) at least one NLP image for training has been further generated beforehand by distinguishing one or more regions, corresponding to each classified piece of the partial mainframe code for training per each of the associated meanings, by each of the colors per each of the associated meanings for each of the 1-st screen image for training to the n-th screen image for training, the design remodeling learning device performs a process of instructing the machine-learning module for training to estimate each piece of the elemental region information for training by further referring to the NLP image for training, wherein, on condition that (i) the NLP has been performed on the mainframe code for testing, (ii) each piece of partial mainframe code for testing per each of the associated meanings has been identified, which has its corresponding associated meaning, among the mainframe code for testing as a result of the NLP, and (iii) at least one NLP image for testing has been further generated beforehand by distinguishing one or more regions, corresponding to each classified piece of the partial mainframe code for testing per each of the associated meanings, by each of the colors per each of the associated meanings for each of the 1-st screen image for testing to the k-th screen image for testing, the processor performs a process of instructing the machine-learning module for testing to output each piece of the elemental region information for testing by further referring to the NLP image for testing.

As one example, the design remodeling learning device performs a process of instructing the machine-learning module for training to estimate each of probabilities of each piece of the elemental region information for training for each of the 1-st screen image for training to the n-th screen image for training belonging to each of the categories, and wherein the processor performs a process of instructing the machine-learning module for testing to output each of probabilities of each piece of the elemental region information for testing for each of the 1-st screen image for testing to the k-th screen image for testing belonging to each of the categories.

As one example, the design remodeling learning device performs a process of determining each specific category corresponding to each highest probability among each of the probabilities of each of the elemental regions for training as each of the categories of each of the elemental regions for training, and wherein the processor performs a process of determining each specific category corresponding to each highest probability among each of the probabilities of each of the categories for each piece of the elemental regions for testing as each of the categories of each of the elemental regions for testing.

As one example, each of the elemental regions for training is classified into sub-categories, wherein the true category information included in the true elemental region information has each of the sub-categories corresponding to each of the elemental regions for training, wherein, during the process of learning the machine-learning module for training, the design remodeling learning device instructs the machine-learning module for training to estimate each of the probabilities of each of the elemental regions for training belonging to each of the sub-categories, wherein the category information corresponding to each of the elemental regions for testing is classified into the sub-categories, and wherein the processor performs a process of instructing the machine-learning module for testing to output each of probabilities of each of the elemental regions for testing belonging to each of the sub-categories.

BRIEF DESCRIPTION OF THE DRAWINGS

The above and other objects and features of the present invention will become apparent from the following description of preferred embodiments given in conjunction with the accompanying drawings, in which:

FIG. 2A is a flow chart schematically illustrating a process of testing the design remodeling testing device to be used for remodeling the text-based screen design into the graphic-based screen design in accordance with one example embodiment of the present disclosure.

FIG. 2B is a flow chart schematically illustrating a process of learning a design remodeling learning device to be used for remodeling the text-based screen design into the graphic-based screen design in accordance with one example embodiment of the present disclosure.

FIG. 3A is a drawing schematically illustrating an example of mainframe code to be used for displaying the text-based screen design on a mainframe computer in accordance with one example embodiment of the present disclosure.

FIG. 3C is a drawing schematically illustrating an example of the screen image, with data being inputted into an editable region by a user, acquired from the screen with the text-based screen design where the execution result of the mainframe code in FIG. 3A is displayed in accordance with one example embodiment of the present disclosure.

FIG. 3E is a drawing schematically illustrating an example of a process of candidate design widgets being displayed for selection that can replace the elemental regions in FIG. 3C in accordance with one example embodiment of the present disclosure.

FIG. 4 is a drawing schematically illustrating an example of a process of the candidate design widgets being displayed for the selection in a development environment to be used for re-hosting text-based design code of the mainframe computer to an open system in accordance with one example embodiment of the present disclosure.

DETAILED DESCRIPTION OF THE PREFERRED EMBODIMENTS

Figure 1:
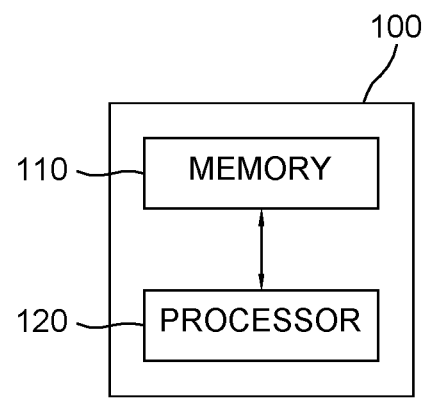
FIG. 1 is a drawing schematically illustrating a design remodeling testing device to be used for remodeling a text-based screen design into a graphic-based screen design in accordance with one example embodiment of the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present invention, although different, are not necessarily mutually exclusive. For example, a particular feature, structure, or characteristic described herein in connection with one embodiment may be implemented within other embodiments without departing from the spirit and scope of the present invention.

In addition, it is to be understood that the position or arrangement of individual elements within each disclosed embodiment may be modified without departing from the spirit and scope of the present invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

To allow those skilled in the art to the present invention to be carried out easily, the example embodiments of the present invention by referring to attached diagrams will be explained in detail as shown below.

FIG. 1 is a drawing schematically illustrating a design remodeling testing device to be used for remodeling at least one text-based screen design into at least one graphic-based screen design in accordance with one example embodiment of the present disclosure.

By referring to FIG. 1, the design remodeling testing device to be used for remodeling the text-based screen design into the graphic-based screen design may include a memory 110 and a processor 120. Herein, the memory 110 may store instructions for the processor 120. In detail, the instructions may be code generated for a purpose of allowing the design remodeling testing device to operate in a specific way, and may be stored in the memory usable or readable by a computer or any programmable data-processing devices. The instructions may perform processes for executing operations disclosed in the present disclosure.

And, the processor 120 may include hardware configuration of MPU (Micro Processing Unit) or CPU (Central Processing Unit), cache memory, data bus, etc. Additionally, OS and software configuration of applications that achieve specific purposes may further be included.

Next, the design remodeling testing device 100 may be connected with a database (not illustrated) which stores information related to at least one screen design, information on at least one screen image, information on one or more candidate design widgets, to be used during a process of remodeling the text-based screen design into the graphic-based screen design. Herein, the database may include at least part of memory of a flash memory type, a hard disk type, a multimedia card micro type, or a card type (for example, SD or XD memory), Random Access Memory (RAM), SRAM (Static Random Access Memory), Read Only Memory (ROM), EEPROM (Electrically Erasable Programmable Read Only Memory), PROM (Programmable Read Only Memory), magnetic memory, magnetic disk, optical disk, but the scope of the present disclosure is not limited thereto, and may include any media capable of storing data. Also, the database may be included in the design remodeling testing device 100 and may store the data transmitted or received, and this may vary according to implementation of the present disclosure.

And, a design remodeling learning device including a machine-learning module for training may be used to remodel the text-based screen design into the graphic-based screen design, and the machine-learning module for training of the design remodeling learning device may be learned in advance by using machine-learning algorithm during which one or more parameters of the machine-learning module for training may be optimized.

If learning of the machine-learning module for training of the design remodeling learning device is completed as such, a testing process using the design remodeling testing device 100 may be performed. Herein, the design remodeling testing device 100 may include a machine-learning module for testing (not illustrated), and the testing process may be performed with the parameters of the machine-learning module for training, optimized by learning thereof, applied to the machine-learning module for testing. Also, a case is assumed above of the design remodeling testing device 100 different from the design remodeling learning device, however, as another example, if the learning of the machine-learning module for training of the design remodeling learning device is completed, then the testing process may be performed by using the design remodeling learning device and the machine-learning module for training, and in that case, the design remodeling testing device 100 and the machine-learning module for testing may (represent same concept and configuration with|be same as) the design remodeling learning device and the machine-learning module for training.

For reference, throughout the present disclosure, the phrase "for training" or "training" is added for terms related to the learning process, and the phrase "for testing" or "testing" is added for terms related to the testing process, to avoid possible confusion. That is, the testing process may represent that the text-based screen design is remodeled into the graphic-based screen design by using the design remodeling testing device 100 to which a result of learning the machine-learning module for training of the design remodeling learning device is applied. That is, in the present disclosure, processes where the phrase "for testing" or "testing" is added may be performed after completion of processes where the phrase "for training" or "training" is added.

The testing process of remodeling the text-based screen design of a mainframe computer into the graphic-based screen design by using the design remodeling testing device 100 as aforementioned is described by referring to FIG. 2A as follows.

FIG. 2A is a flow chart schematically illustrating the testing process of the design remodeling testing device to be used for remodeling the text-based screen design of the mainframe computer into the graphic-based screen design in accordance with one example embodiment of the present disclosure.

By referring to FIG. 2A, the testing process of remodeling the text-based screen design of the mainframe computer into the graphic-based screen design starts, at a step of S201, on condition that the machine-learning module for training has been learned by the design remodeling learning device, and that the parameters of the machine-learning module for training have been applied to the machine-learning module for testing of the design remodeling testing device 100. The learning process of the machine-learning module for training using the design remodeling learning device is described in detail by referring to FIG. 2B as follows.

Next, the design remodeling testing device 100 may perform a process of acquiring each of a 1-st screen image for testing to a k-th screen image for testing from each of a 1-st screen for testing to a k-th screen for testing, respectively, in which the 1-st screen for testing to the k-th screen for testing may be screens resulting from execution of 1-st code for testing to be remodeled, and k may be an integer larger than 0, at a step of S202. Herein, as an example, if at least one editable region with no initial value or no initial text displayed as a region for receiving input data, where data inputted by a user, e.g., a developer, is displayed once the data is inputted, is present on a screen resulting from the execution of the 1-st code for testing, then at least one screen image for testing may be generated and acquired with the inputted data being displayed within the region for receiving the input data. As another example, during acquisition of each of the 1-st screen image for testing to the k-th screen image for testing, a process of adjusting properties, such as a size, of the screen image for testing according to the implementation of the present disclosure may further be performed, and as a result, coordinates of regions, etc. included in each of the 1-st screen image for testing to the k-th screen image for testing may be adjusted.

Then, the design remodeling testing device 100 may perform a process of instructing the machine-learning module for testing to apply at least one machine-learning operation to the 1-st screen image for testing to the k-th screen image for testing at a step of S203, to thereby generate each piece of elemental region information for testing including coordinates information for testing, elemental region size information for testing, and category information on each of one or more elemental regions for testing, at a step of S204. Herein, at least part of the elemental regions for testing may be included in corresponding each of the 1-st screen image for testing to the k-th screen image for testing. Further, the elemental regions for testing may be one or more regions divided per each of elements for testing and each of the elements for testing may be interpretable as having each meaning, e.g., an input function or an input category representing whether each of the elements for testing is editable by the user, in each of the 1-st screen image for testing to the k-th screen image for testing. For example, if text of "<yyyy> <mm> <dd>" and editable regions to be used for receiving inputs corresponding thereto are present on the screen image for testing, then a set comprised of said editable regions and the text of "<yyyy> <mm> <dd>" may be interpreted as an element representing that the set is used for receiving a date input, and the region corresponding to the set may be one of the elemental regions for testing.

Also, the machine-learning operation used for identifying each of the elemental regions for testing may be operation using the machine-learning algorithm capable of detecting an object in an image. And various machine-learning algorithm, e.g., R-CNN (Regions with Convolutional Neural Network), YOLO (You Only Look Once), SSD (Single Shot Detector), etc., to detect the object in the image may be adopted according to the implementation of the present disclosure and may be used during the testing process of the present disclosure.

And, as one example, the design remodeling testing device 100 may perform a process of instructing the machine-learning module for testing to generate each piece of the elemental region information for testing on at least part of the elemental regions for testing included in corresponding each of the 1-st screen image for testing to the k-th screen image for testing, by further referring to the 1-st code for testing, at a step of S204. Herein, the 1-st code for testing may be mainframe code for testing implemented in a programming language used on the mainframe computer, and explanation below assumes that the 1-st code for testing is the mainframe code for testing, but the scope of the present disclosure is not limited thereto, and a programming language for implementing the 1-st code for testing may vary as the case may be.

Also, as another example, on condition that (i) preceding analysis of the mainframe code for testing has been completed, (ii) each of at least one piece of partial mainframe code for testing per each of categories, corresponding to each of functions to be implemented on a screen if its corresponding piece of the mainframe code for testing is executed, has been classified as a result of the preceding analysis, and (iii) at least one code-function image for testing has been further generated beforehand by distinguishing one or more regions, corresponding to each classified piece of the partial mainframe code for testing per each of the categories, by each of the colors for each of the 1-st screen image for testing to the k-th screen image for testing, the design remodeling testing device 100 may perform a process of instructing the machine-learning module for testing to output each piece of the elemental region information for testing by further referring to at least one code-function image for testing. A process of generating the code-function image for testing from the mainframe code for testing is described by referring to FIG. 5 as below.

Figure 5:
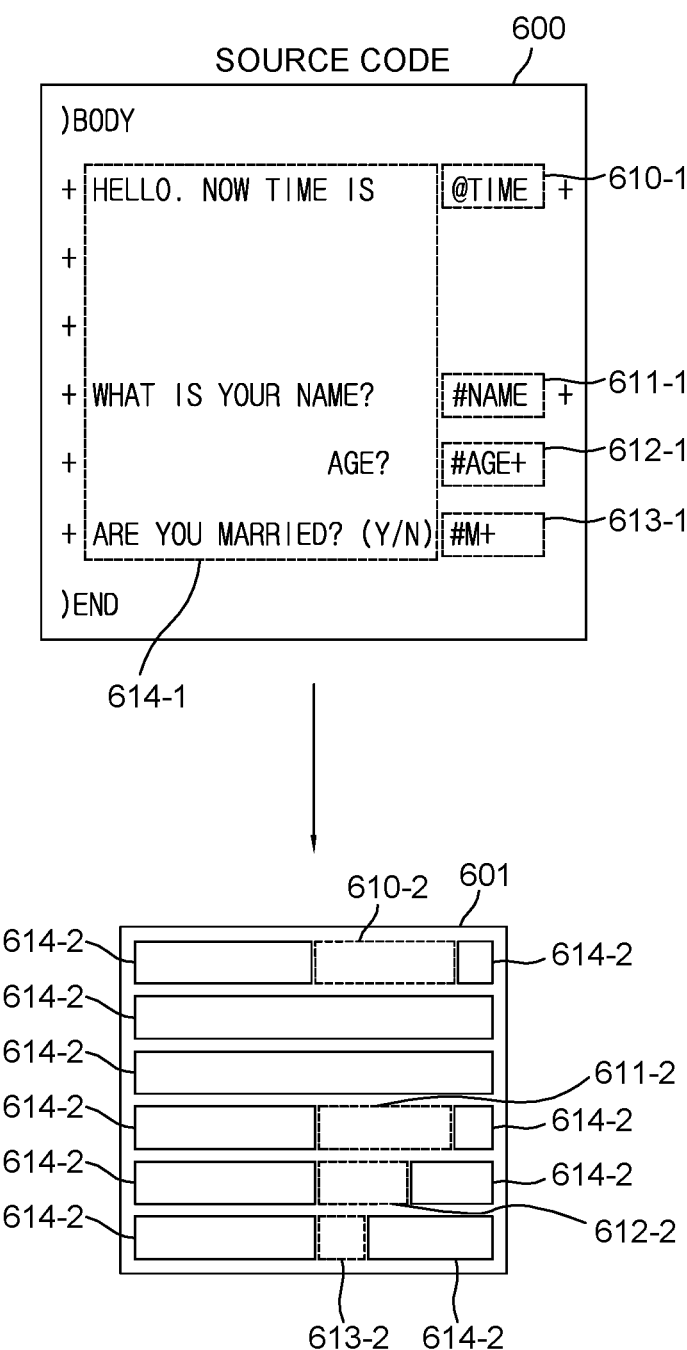
FIG. 5 is a drawing schematically illustrating a process of generating at least one code-function image that can further be referred to during a testing process using the design remodeling testing device or during a learning process using the design remodeling learning device in accordance with one example embodiment of the present disclosure.

FIG. 5 is a drawing schematically illustrating a process of generating at least one code-function image that can further be referred to during the testing process using the design remodeling testing device or during the learning process using the design remodeling learning device in accordance with one example embodiment of the present disclosure.

By referring to FIG. 5, during the testing process using the design remodeling testing device 100, supposing that source code 600 in FIG. 5 is the mainframe code for testing, then a function of displaying text included in the mainframe code for testing, a function of receiving data, a function of outputting requested data, etc. may be implemented on a screen when the mainframe code for testing is executed. Herein, a process of classifying each piece of the partial mainframe code for testing per each of the categories by using a result of preceding analysis of the mainframe code for testing may be performed in advance. Further, each piece of the partial mainframe code for testing per each of the categories may correspond to each of the functions implemented on the screen. In detail, the mainframe code for testing may include partial code 610-1 for outputting time data, partial code 611-1 to 613-1 for receiving data such as characters, numbers, and 'y' or 'n', and partial code 614-1 for outputting text included in the mainframe code for testing, all of which may be identified by the preceding analysis of the mainframe code for testing. And, each of regions on the screen image for testing corresponding to each piece of the partial mainframe code for testing per each of the categories, i.e., per each of the functions, may be distinguished by each of the colors, to thereby generate code-function image for testing. FIG. 5 is an example of the code-function image 601 showing a 1-st colored region 610-2 where a function of outputting the requested data (time) is implemented, 2-nd colored regions 611-2 to 613-2 where a function of receiving the data is implemented, and a 3-rd colored region 614-2 where a function of displaying the text included in the code is implemented. And if the source code 600 is the mainframe code for testing, the code-function image 601 may be the color-sectioned image for testing. Herein, the drawings are in black and white for convenience.

Also, as another example, the code-function image for testing showing no color for at least one specific region where at least one specific function is implemented may be generated, and this may vary as the case may be.

By identifying each function of each piece of the partial mainframe code for testing per each of the categories, and by further referring to the code-function image for testing whose corresponding regions on the screen are distinguished by each of the colors per each of the categories, each of boundaries and properties of each of the elemental regions in each screen image for testing may be determined accurately, and information on the candidate design widgets to be used for replacement may be provided accurately, during the testing process using the design remodeling testing device 100.

And, as still another example, on condition that (i) natural language processing (NLP) has been performed on the mainframe code for testing, (ii) each piece of partial mainframe code for testing per each of associated meanings has been identified, which has its corresponding associated meaning, among the mainframe code for testing as a result of the NLP, and (iii) at least one NLP image for testing has been further generated beforehand by distinguishing one or more regions, corresponding to each classified piece of the partial mainframe code for testing per each of the associated meanings, by each of the colors for each of the 1-st screen image for testing to the k-th screen image for testing, the design remodeling testing device 100 may perform a process of instructing the machine-learning module for testing to output each piece of the elemental region information for testing by further referring to the NLP image for testing. A process of generating the NLP image for testing from the mainframe code for testing as such is described by referring to FIG. 6 as below.

Figure 6:
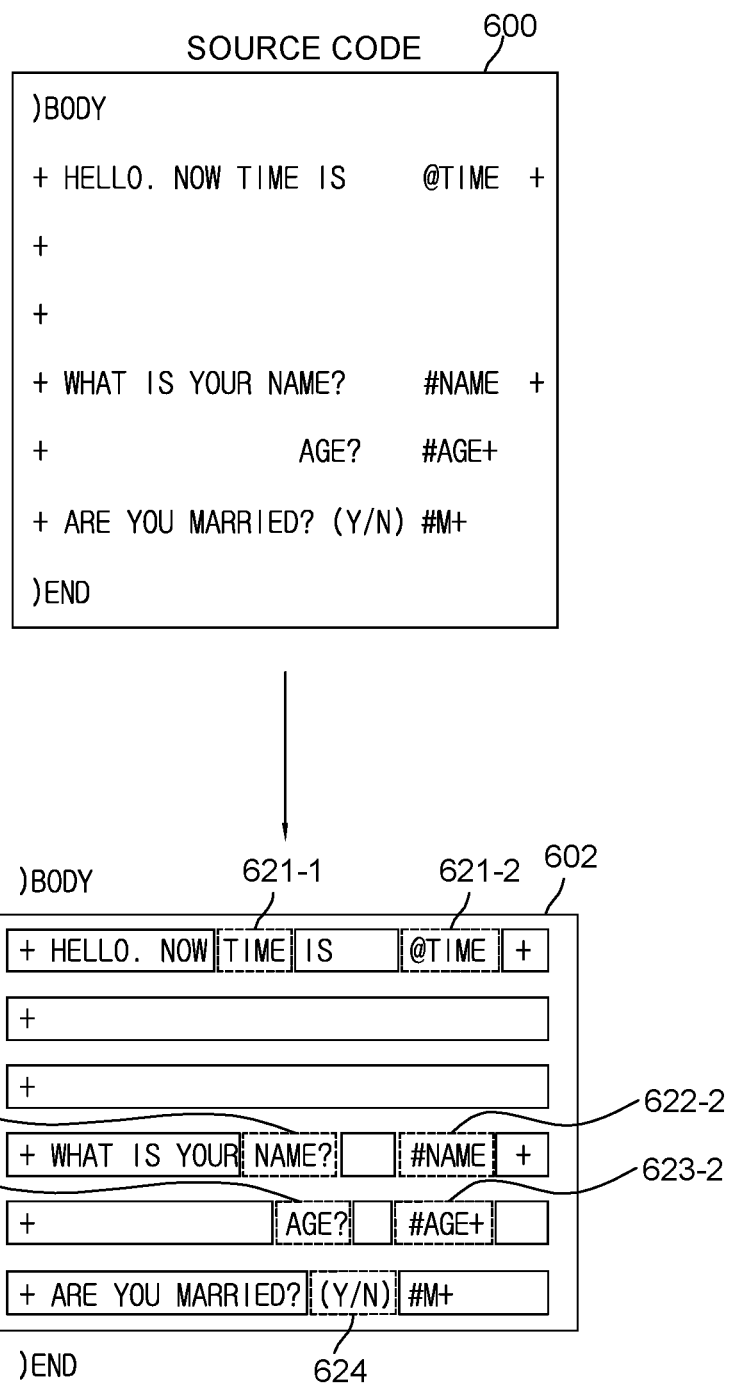
FIG. 6 is a drawing schematically illustrating a process of generating a natural language processing (NLP) image that can further be referred to during the testing process using the design remodeling testing device or during the learning process using the design remodeling learning device in accordance with one example embodiment of the present disclosure.

FIG. 6 is a drawing schematically illustrating a process of generating an NLP image that can further be referred to during the testing process using the design remodeling testing device or during the learning process using the design remodeling learning device in accordance with one example embodiment of the present disclosure.

By referring to FIG. 6, during the testing process using the design remodeling testing device 100, supposing that the source code 600 in FIG. 5 is the mainframe code for testing, then the NLP may be performed on the mainframe code for testing, to thereby identify each piece of the partial mainframe code for testing per each of the associated meanings corresponding to at least one specific phrase with a specific intention and its associated phrases, among the mainframe code for testing. Specifically, the specific phrase with the specific intention (of providing the user with some information) may be included in the mainframe code for testing. For example, the NLP on the specific phrase like "(Y/N)", "Press 'X' to select", etc. may reveal that the specific phrase has meaning of requesting a user to input one-byte-long data of Y, N or X, and probabilities of said associated phrases being present near the specific phrase may be acquired. If information on each piece of the partial mainframe code for testing per each of the associated meanings corresponding to the specific phrase with the specific intention and its associated phrases, among the mainframe code for testing, is identified as such, the NLP image for testing, created by indicating each of the colors per each of the associated meanings on the screen image for testing based on a result of the identification, may be generated. FIG. 6 illustrates an example of the NLP image 602 showing 1-st colored phrases 621-1 and 621-2 with a meaning relevant to inputting and outputting of time data associated with 'time', 2-nd colored phrases 622-1 and 622-2 with a meaning relevant to inputting and outputting of text data associated with 'name', 3-rd colored phrases 623-1 and 623-2 with a meaning relevant to inputting and outputting of numerical data associated with 'age', a 4-th colored phrase 624 with a meaning relevant to inputting and outputting of 'y' or 'n' text data associated with confirmation, and 5-th colored phrases with an unknown meaning illustrated without the reference numerals. Herein, the drawings are in black and white for convenience. And if the source code 600 is the mainframe code for testing, the NLP image 602 may be the color-sectioned image for testing. And, FIG. 6 shows the source code 600 together with the NLP image 602 for convenience of explanation, however, the NLP image actually used in the present disclosure may not show any code. Also, the NLP image showing no color for at least part of phrases such as the phrases with unknown meaning may be generated, and this may vary as the case may be.

And, the code-function image 601, described by referring to FIG. 5, may show regions distinguished by each of the colors as the NLP image 602 described by using similar color. However, both the code-function image for testing and the NLP image for testing may be used during the testing process as the case may be, and in that case, the color per each of the categories used on the code-function image for testing and the color per each of the associated meanings used in the NLP image for testing may differ, to avoid confusion, also as the case may be.

Also, as still yet another example, during the testing process, each of the 1-st screen image for testing to the k-th screen image for testing may be combined with at least part of its corresponding each of the code-function images for testing and each of the NLP images for testing, and the combined results may be used as input data for the testing process. Herein, as the case may be, (i) a specific screen image for testing selected among the 1-st screen image for testing to the k-th screen image for testing, and its corresponding code-function image for testing and/or its corresponding NLP image for testing may be combined, with their properties like opaqueness adjusted, to thereby generate at least one integrated image, or (ii) the specific screen image for testing, and its corresponding code-function image for testing and/or its corresponding NLP image for testing may be divided into multiple regions based on a 1-st criterion, and one of the divided image of the specific screen image for testing, and one of the divided code-function image for testing and/or one of the divided NLP image for testing may be selected for each of the divided multiple regions and combined in a form of a grid, to thereby generate the integrated image which may then be inputted into the design remodeling testing device 100 for the testing process.

(i) By identifying each piece of the partial mainframe code for testing per each of the associated meanings, corresponding to the specific phrase with the specific intention and its associated phrases, among the mainframe code for testing, as such, and (ii) by further referring to the NLP image for testing whose corresponding regions are distinguished by each of the colors per each of the associated meanings, each of the boundaries and the properties of each of the elemental regions in each of the screen image for testing may be determined accurately, and the information on the candidate design widgets for the replacement may be provided accurately, during the testing process using the design remodeling testing device 100.

Next, the design remodeling testing device 100 may perform (i) a process of retrieving the information on the candidate design widgets, with which each of the elemental regions for testing is replaced, from the database, by referring to the outputted elemental region information for testing and (ii) a process of providing or supporting another device, e.g., a user device, to provide the information on the candidate design widgets, at a step of S205. In detail, the database may store information on the candidate design widgets per each of the categories beforehand, and the design remodeling testing device 100 may perform (i) a process of allowing the user to select one of the candidate design widgets by separately displaying information on the candidate design widgets, or supporting another device, e.g., the user device, to provide the information on the candidate design widgets by referring to the elemental region information for testing generated for the specific screen image for testing, and (ii) a process of placing the selected one of the candidate design widgets by the user on its corresponding elemental region for testing.

Herein, as one example, if the design remodeling testing device 100 performs the testing process by further referring to the mainframe code for testing, then the information on the candidate design widgets stored in the database may further include information on 2-nd code for testing corresponding to the candidate design widgets, and if the user, i.e., the developer, selects one of the candidate design widgets provided for a specific elemental region for testing among the elemental regions for testing, then the design remodeling testing device 100 may perform a process of replacing (i) each piece of specific partial mainframe code for testing, corresponding to the specific elemental region for testing, among the mainframe code for testing with (ii) the 2-nd code for testing corresponding to the selected one of the candidate design widgets. Also, as another example, in case that the 2-nd code for testing corresponding to the candidate design widgets is implemented in a programming language different from that of the 1-st code for testing, a process of converting at least one of the 1-st code for testing and the 2-nd code for testing or a process of providing mutual compatibility between the 1-st code for testing and the 2-nd code for testing using a software library may further be performed in order for the 1-st code for testing to correspond to the 2-nd code for testing, or vice versa. Herein, the 1-st code for testing, which is the mainframe code for testing, may be implemented in one of programming languages according to software, e.g., CICS, IMS, AIM, ISPF, etc. used in the mainframe computer, and each piece of the 2-nd code for testing corresponding to each of the candidate design widgets may be implemented in a markup language which is code representing data structures of the candidate design widgets, but the scope of the present disclosure is not limited thereto.

Also, as another example, even before the user selects any of the candidate design widgets, one of the multiple candidate design widgets stored in the database may be set as a default design widget beforehand, and if the specific elemental region for testing is determined, the piece of specific partial mainframe code for testing, corresponding to the specific elemental region for testing, may be automatically replaced with the 2-nd code for testing of the default design widget corresponding to the specific elemental region for testing, as the case may be.

And, as still another example, on condition that variables mapping information on at least part of mapping relation of one or more variables between at least part of the mainframe code for testing and at least part of the 2-nd code for testing corresponding to at least part of the candidate design widgets has been generated beforehand by referring to 1-st variable information on each of one or more variables used in the mainframe code for testing and 2-nd variable information on each of one or more variables used in each of the candidate design widgets, the design remodeling testing device 100 may perform a process of replacing (i) each piece of the specific partial mainframe code for testing, corresponding to the specific elemental region for testing, among the mainframe code for testing with (ii) the 2-nd code for testing corresponding to the selected one of the candidate design widgets, by further referring to the variables mapping information. For example, in case that an elemental region for outputting time is to be replaced with a clock design widget, if the piece of the specific partial mainframe code for testing, corresponding to the elemental region for outputting time, uses a variable "TIME" but the 2-nd code for testing of the clock design widget uses a variable "T" for inputting and outputting the data, then the clock design widget will not work by simple replacement of the piece of the specific partial mainframe code for testing corresponding to the elemental region for outputting time with the 2-nd code for testing of the clock design widget. Therefore, a process of generating a piece of the variables mapping information representing that the variable "TIME" must be mapped onto the variable "T", or vice versa, in the above example by referring to 1-st variable information on each of the variables used in the mainframe code for testing and 2-nd variable information on each of the variables used in each of the candidate design widgets may be performed, and then a process of adjusting each of the variables to match one another by referring to the variables mapping information may further be performed, when replacing the piece of the specific partial mainframe code for testing with the 2-nd code for testing during the testing process in order to allow the design widget, corresponding to the 2-nd code for testing, to function normally.

In order to perform the testing process aforementioned, the machine-learning module for training of the design remodeling learning device must be learned beforehand, and the learning process thereof is described by referring to FIG. 2B as follows.

FIG. 2B is a flow chart schematically illustrating a process of learning the design remodeling learning device to be used for remodeling the text-based screen design into the graphic-based screen design in accordance with one example embodiment of the present disclosure.

By referring to FIG. 2B, the learning process of the machine-learning module for training of the design remodeling learning device may start on condition that each piece of true elemental region information has been determined beforehand comprised of true coordinates information, true elemental region size information, and true category information on each of one or more elemental regions for training. Herein, at least part of the elemental regions for training may be included in corresponding each of a 1-st screen image for training to an n-th screen image for training respectively acquired from each of a 1-st screen for training to an n-th screen for training resulting from execution of 1-st code for training, at a step of S101.

Herein, as an example, if at least one editable region with no initial value or no initial text displayed as a region for receiving the input data, where data inputted by the user, i.e., the developer, is displayed once the data is inputted, is present on a screen resulting from the execution of the 1-st code for training, then at least one screen image for training may be generated and acquired with the inputted data being displayed within the region for receiving the input data. As another example, during acquisition of each of the 1-st screen image for training to the n-th screen image for training, a process of adjusting properties, such as a size, of the screen image for training according to the implementation of the present disclosure may further be performed, and as a result, coordinates of regions, etc. included in each of the 1-st screen image for training to the n-th screen image for training may be adjusted.

And, the elemental regions for training may be one or more regions divided per each of elements for training and each of the elements for training may be interpretable as having each meaning, e.g., an input function or an input category representing whether each of the elements for training is editable by the user, in each of the 1-st screen image for training to the n-th screen image for training. The elemental regions for training is similar to the elemental regions for testing, and their details are omitted.

And, the true elemental region information may include actual information on coordinates, region sizes, and categories of each of the elemental regions for training determined by separately checking on at least part of the elemental regions for training included in corresponding each of the 1-st screen image for training to the n-th screen image for training, and each piece of the true elemental region information may be assigned as each label to each of its corresponding 1-st screen image for training to the n-th screen image for training. For example, if a specific elemental region included in a specific screen image for training is an elemental region of an INPUT category with a region size of a width 20 and a height 5 starting from the coordinates (10, 15), then the true elemental region information may be data in a form of (10, 15, 20, 5, INPUT) and the true elemental region information may be assigned to the specific screen image as a label, i.e., additional information.

Next, the design remodeling learning device may acquire each of the 1-st screen image for training to the n-th screen image for training at a step of S102, and may perform a process of instructing the machine-learning module for training to apply the machine-learning operation to each of the 1-st screen image for training to the n-th screen image for training at a step of S103, to thereby estimate each piece of elemental region information for training comprised of coordinates information for training, elemental region size information for training, and category information on each of one or more elemental regions for training, at a step of S104. Herein, at least part of the elemental regions for training may be included in corresponding each of the 1-st screen image for training to the n-th screen image for training.

Also, the machine-learning operation used for identifying each of the elemental regions for training may be operation using the machine-learning algorithm capable of detecting an object in an image. And various machine-learning algorithm, e.g., R-CNN (Regions with Convolutional Neural Network), YOLO (You Only Look Once), SSD (Single Shot Detector), etc., to detect the object in the image may be adopted according to the implementation of the present disclosure and may be used during the learning process of the present disclosure.

Then, the design remodeling learning device may perform a process of instructing the machine-learning module for training to calculate one or more losses by referring to each piece of the estimated elemental region information for training and its corresponding piece of true elemental region information at a step of S105, and adjust the parameters of the machine-learning module for training by backpropagating the losses at a step of S106. For example, regarding the specific elemental region for training, if a width of its region size estimated by the machine-learning module for training is 55, and if a width of its region size included in the true elemental region information on the specific elemental region for training is 50, a difference 5 or its processed value may be outputted as the losses, and the parameters of the machine-learning module for training may be optimized by repeating a process of adjusting the parameters of the machine-learning module for training via backpropagating the losses such that the losses are minimized.

And, as one example, the design remodeling learning device may perform a process of instructing the machine-learning module for training to estimate each piece of the elemental region information for training on at least part of the elemental regions for training included in corresponding each of the 1-st screen image for training to the n-th screen image for training, by further referring to the 1-st code for training, at a step of S104. Herein, the 1-st code for training may be mainframe code for training implemented in a programming language used on the mainframe computer, and explanation below assumes that the 1-st code for training is the mainframe code for training, but the scope of the present disclosure is not limited thereto, and a programming language for implementing the 1-st code for training may vary as the case may be.

Also, as another example, on condition that (i) preceding analysis of the mainframe code for training has been completed, (ii) each of at least one piece of partial mainframe code for training per each of the categories, corresponding to each of functions to be implemented on a screen if its corresponding piece of the mainframe code for training is executed, has been classified as a result of the preceding analysis, and (iii) at least one code-function image for training has been further generated beforehand by distinguishing one or more regions, corresponding to each classified piece of the partial mainframe code for training per each of the categories, by each of the colors for each of the 1-st screen image for training to the n-th screen image for training, the design remodeling learning device may perform a process of instructing the machine-learning module for training to estimate each piece of the elemental region information for training by further referring to the code-function image for training. Herein, a process of generating the code-function image for training from the mainframe code for training is similar to a process of generating the code-function image for testing by referring to FIG. 5, and supposing that the source code 600 in FIG. 5 is the mainframe code for training, a process of classifying each piece of the partial mainframe code for training per each of the categories, corresponding to each of the functions implemented on the screen, by using the preceding analysis of the mainframe code for training may be performed, and the code-function image for training may be generated by distinguishing each region on the screen image for training corresponding to each piece of the partial mainframe code for training by each of the colors per each of the categories. And if the source code 600 is the mainframe code for training, the code-function image 601 in FIG. 5 may be the color-sectioned image for training. Details of the code-function image for training as such are similar to those of the code-function image for testing, and thus omitted.

By identifying each function of each piece of the partial mainframe code for training per each of the categories, and by further referring to the code-function image for training whose corresponding regions on the screen image for training are distinguished by each of the colors per each of the categories, each of boundaries and properties of each of the elemental regions in each of the screen image for training may be determined accurately, during the learning process using the design remodeling training device.

And, as still another example, on condition that (i) the NLP has been performed on the mainframe code for training, (ii) each piece of partial mainframe code for training per each of the associated meanings has been identified, which has its corresponding associated meaning, among the mainframe code for training as a result of the NLP, and (iii) at least one NLP image for training has been further generated beforehand by distinguishing one or more regions, corresponding to each classified piece of the partial mainframe code for training per each of the associated meanings, by each of the colors for each of the 1-st screen image for training to the n-th screen image for training, the design remodeling learning device may perform a process of instructing the machine-learning module for training to estimate each piece of the elemental region information for training by further referring to the NLP image for training. Herein, a process of generating the NLP image for training from the mainframe code for training is similar to a process of generating the NLP image for testing by referring to FIG. 6, and supposing that source code 600 in FIG. 6 is the mainframe code for training, a process of identifying each piece of the partial mainframe code for training per each of the associated meanings, corresponding to at least one specific phrase with a specific intention and its associated phrases, among the mainframe code for training, may be performed by applying the NLP to the mainframe code for training. Herein, the NLP image for training may be generated by distinguishing each region on the screen image for training corresponding to each piece of the partial mainframe code for training per each of the associated meanings by each of the colors. And if the source code 600 is the mainframe code for training, the NLP image 602 in FIG. 6 may be the color-sectioned image for training. Details of the NLP image for training as such are similar to those of the NLP image for testing, and thus omitted.

By identifying each piece of the partial mainframe code for training per each of the associated meanings, and by further referring to the NLP image for training whose corresponding regions on the screen image for training are distinguished by each of the colors per each of the associated meanings, each of the boundaries and the properties of each of the elemental regions in each of the screen image for training may be determined accurately.

And, the code-function image 601, described by referring to FIG. 5, may show regions distinguished by each of the colors as the NLP image 602 described by using similar color. However, both the code-function image for training and the NLP image for training may be used during the learning process as the case may be, and in that case, the color per each of the categories used on the code-function image for training and the color per each of the associated meanings used in the NLP image for training may differ, to avoid confusion, as the case may be.

Also, as still another example, during the learning process, each of the 1-st screen image for training to the n-th screen image for training may be combined with at least part of its corresponding each of the code-function images for training and each of the NLP images for training, and the combined results may be used as input data for the learning process. Herein, as the case may be, (i) a specific screen image for training selected among the 1-st screen image for training to the n-th screen image for training, and its corresponding code-function image for training and/or its corresponding NLP image for training may be combined, with their properties like opaqueness adjusted, to thereby generate at least one integrated image, or (ii) the specific screen image for training, and its corresponding code-function image for training and/or its corresponding NLP image for training may be divided into multiple regions based on a 2-nd criterion, and one of the divided image of one of the specific screen image for training, and one of the divided code-function image for training and/or one of the divided NLP image for training may be selected for each of the divided multiple regions and combined in a form of a grid, to thereby generate the integrated image which may be inputted into the design remodeling learning device for the learning process of the machine-learning module for training.

The learning process using the design remodeling learning device and the machine-learning module for training as aforementioned, and the testing process using the design remodeling testing device 100 and the machine-learning module for testing may be changed as below.

As one example, the design remodeling learning device may perform a process of instructing the machine-learning module for training to estimate each of probabilities of each piece of the elemental region information for training on each of the 1-st screen image for training to the n-th screen image for training belonging to each of the categories. And the design remodeling testing device 100 may perform a process of instructing the machine-learning module for testing to output each of probabilities of each piece of the elemental region information for testing on each of the 1-st screen image for testing to the k-th screen image for testing belonging to each of the categories.

And, as another example, the design remodeling learning device may perform a process of determining each specific category corresponding to each highest probability among each of the probabilities of each of the elemental regions for training as each of the categories of each of the elemental regions for training. And, the design remodeling testing device 100 may performs a process of determining each specific category corresponding to each highest probability among each of the probabilities of each of the elemental regions for testing as each of the categories of each of the elemental regions for testing.

For example, supposing that the categories include an INPUT category for receiving data, an OUTPUT category for outputting requested data, and a TEXT category for displaying text included in the code, then if the machine-learning module for training of the design remodeling learning device estimates the probability of the specific elemental region for training belonging to the INPUT category as 0.8, since the true category of the specific elemental region for training is the INPUT category, a difference 0.2 or its processed value between said 0.8 and the probability 1.0 of the INPUT category may be used for the learning process as the losses. If the parameters of the machine-learning module for training are optimized by repeating the processes as such, that is, if the learning process is completed, the testing process with the design remodeling testing device 100 including the machine-learning module for testing, to which the parameters are applied, may be performed. On the condition that the learning process has been successful, if the specific elemental region included in the screen image for testing belongs to the INPUT category, the machine-learning module for testing of the design remodeling testing device 100 may output the probability of the specific elemental region belonging to the INPUT category as a value as high as approximately 1.0.

Also, supposing that the categories include the INPUT category for receiving the data, the OUTPUT category for outputting the requested data, and the TEXT category for displaying text included in the code, then if the machine-learning module for training of the design remodeling learning device estimates the probability of the specific elemental region for training belonging to the INPUT category as 0.7, the probability of the specific elemental region for training belonging to the OUTPUT category as 0.2, and the probability of the specific elemental region for training belonging to the TEXT category as 0.1, then the INPUT category having the highest probability of 0.7 may be determined as the category of the specific elemental region for training. Also, a process of determining the category of each of the elemental regions for training during the learning process may be similarly applied to a process of determining the category of each of the elemental regions for testing during the testing process.

And, as another example, each of the elemental regions for training may be classified into one or more sub-categories, and the true category information included in the true elemental region information may include each of one or more true sub-categories corresponding to each of the elemental regions for training. Further, during the learning process of the machine-learning module for training, the design remodeling learning device may instruct the machine-learning module for training to estimate each of the probabilities of each of the elemental regions for training belonging to each of the sub-categories. Also, each of the categories corresponding to each of the elemental regions for testing may be classified into the sub-categories, and the design remodeling testing device 100 may perform a process of instructing the machine-learning module for testing to output each of probabilities of each of the elemental regions for testing belonging to each of the sub-categories.

For example, as in a Table 1 below, supposing that the categories (INPUT, OUTPUT, TEXT . . . ) are classified into the sub-categories, if the specific elemental region for training belongs to (i) the INPUT category among the categories and (ii) an Input_multiLength sub-category among the sub-categories, then (i) "INPUT" data corresponding to the "INPUT" category and (ii) "Input_multiLength" data corresponding to the "Input_multiLength" sub-category may be assigned to the specific elemental region for training together as the true elemental region information of the specific elemental region for training, that is, as the labels. Also, during the learning process using the design remodeling learning device, if the categories include the INPUT category, the OUTPUT category, and the TEXT category, then each of the probabilities of the specific elemental region for training respectively belonging to the INPUT category, the OUTPUT category, and the TEXT category may be outputted as corresponding to each of the categories. If the categories include the sub-categories Input_multiLength, Input_shortLength, . . . then probabilities of both the INPUT category and the Input_multiLength sub-category may be high. Also, a process of estimating each of the probabilities of the specific elemental region for training belonging to each of the categories during the learning process may be similarly applied to a process of estimating each of the probabilities of the specific elemental region for testing belonging to each of the categories during the testing process.

Such a hierarchy of the categories may be set as in the Table 1 below, but the scope of the present disclosure is not limited thereto, and its depths, the number of the categories, and its contents may vary as the case may be.

TABLE 1

| categories | sub-categories | Content |
|---|---|---|
| INPUT | | can receive every input of the user |
| INPUT | Input_multiLength | can receive every input of the user, typically long data |

TABLE 1-continued

| categories | sub-categories | Content |
|---|---|---|
| | Input_shortLength | can receive every input of the user, typically command data |
| | Input_1Length | can receive every input of the user, typically a single piece of data |
| | Input_multiLength_text | receives input of the user, any long text |
| | Input_multiLength_date | receives input of the user, long dates |
| | Input_1Length_yn | receives input of the user, a single piece of data, limited to 'y' or 'n' |
| OUTPUT | | outputs a result |
| OUTPUT | Output_table_graphable | outputs a result, continuous data of numerical tables |
| TEXT | | displays text |
| ... | ... | ... |

The mainframe code and each of the screen images, acquired from the screen resulting from the execution of the mainframe code, are described by referring to the drawings, as examples that may be used in the learning method and the testing method as aforementioned.

FIG. 3A is a drawing schematically illustrating an example of the mainframe code to be used for displaying the text-based screen design on the mainframe computer in accordance with one example embodiment of the present disclosure.

Figure 3B:
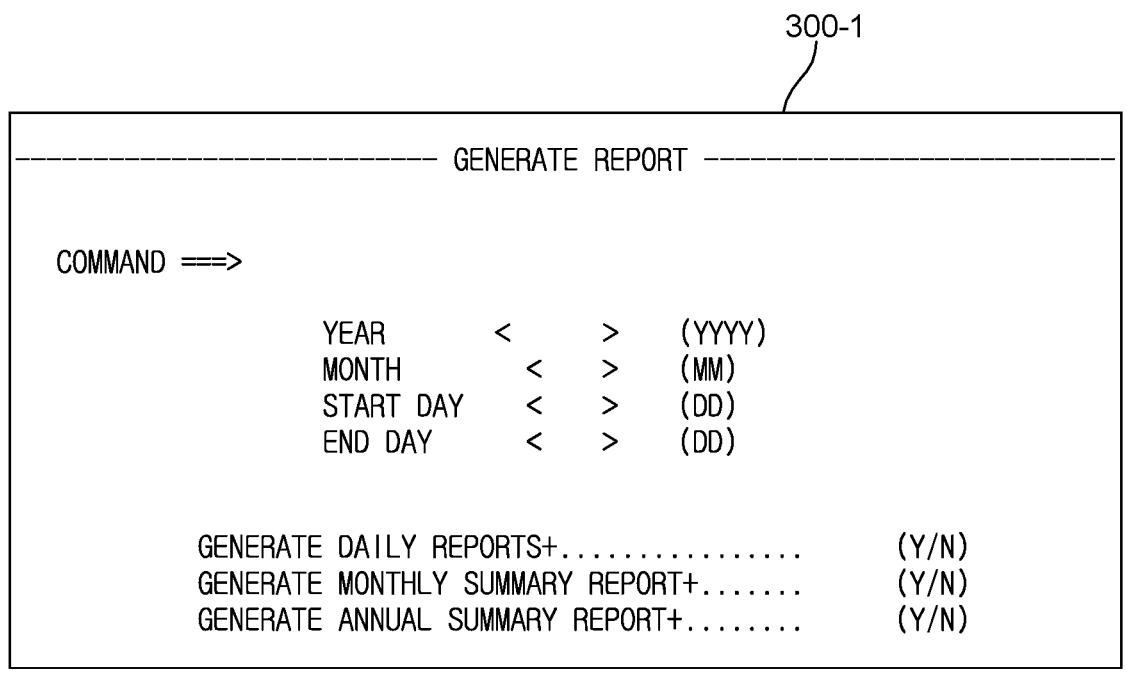
FIG. 3B is a drawing schematically illustrating an example of a screen image acquired from a screen with the text-based screen design where an execution result of the mainframe code in FIG. 3A is displayed in accordance with one example embodiment of the present disclosure.

The mainframe code in FIG. 3A is shown as including multiple pieces of partial code 301-1 to 309-1 for implementing a function of displaying text on the screen, and multiple pieces of partial code 310-1 to 314-1 for implementing a function of receiving input from the user. And, examples of the screen images acquired from a text-based screen, displayed by the execution of the mainframe code, are shown in FIGS. 3B and 3C.

FIG. 3B is a drawing schematically illustrating an example of a screen image acquired from a screen with the text-based screen design where an execution result of the mainframe code in FIG. 3A is displayed in accordance with one example embodiment of the present disclosure. Also, FIG. 3C is a drawing schematically illustrating an example of the screen image, with data being inputted into at least one editable region by the user, acquired from the screen with the text-based screen design where the execution result of the mainframe code in FIG. 3A is displayed in accordance with one example embodiment of the present disclosure. Herein, if the code in FIG. 3A is the mainframe code for training, then a screen image 300-1 in FIG. 3B and a screen image 300-2 in FIG. 3C may be examples of the screen image for training, and if the code in FIG. 3A is the mainframe code for testing, then the screen image 300-1 in FIG. 3B and the screen image 300-2 in FIG. 3C may be examples of the screen image for testing.

Figure 3D:
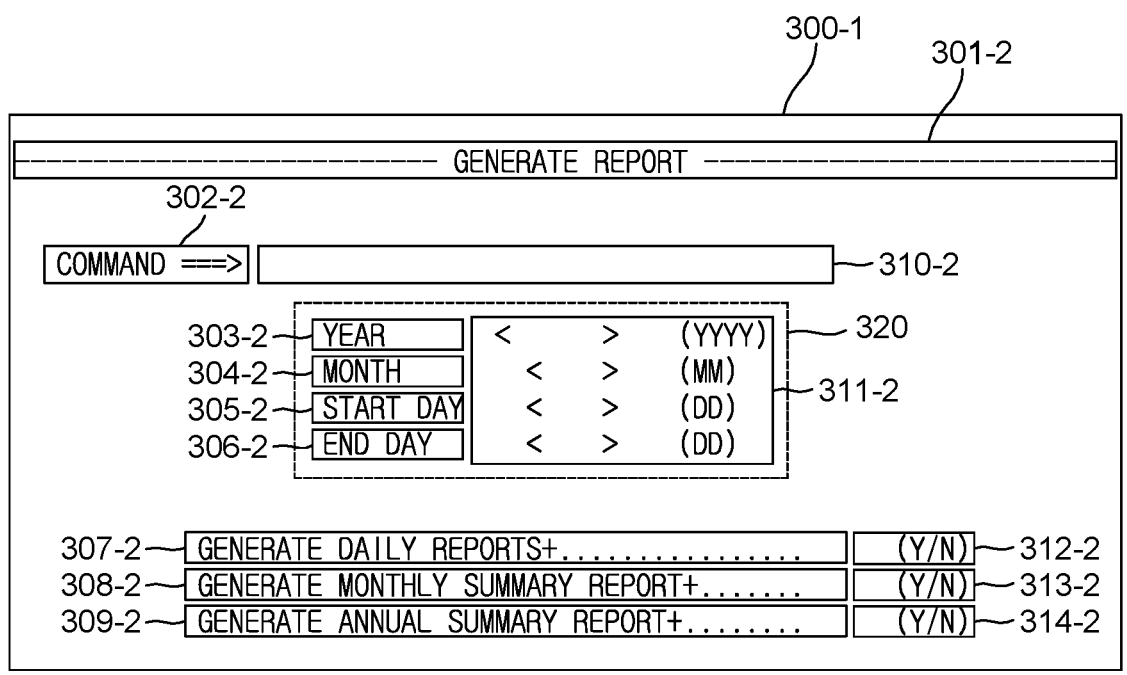
FIG. 3D is a drawing schematically illustrating each of the elemental regions distinguished in the screen image in FIG. 3B in accordance with one example embodiment of the present disclosure.

Next, on the screen image acquired from the screen resulting from the execution of the mainframe code in FIG. 3A, the multiple regions, displayed on the screen for each of their functions by execution of the multiple pieces of the partial code included in the mainframe code, may be present, and FIG. 3D illustrates an example of the screen image showing each of the multiple regions as boxes.

FIG. 3D is a drawing schematically illustrating each of the elemental regions distinguished in the screen image in FIG. 3B in accordance with one example embodiment of the present disclosure. Herein, the elemental regions may be one or more regions divided per each of the elements and each of the elements may be interpretable as having each meaning, e.g., one of the functions or one of the categories, and since the elemental regions are similar to the elemental regions for training or the elemental regions for testing, their details are omitted.

By referring to FIG. 3D, multiple text regions 301-2 to 309-2, each of which corresponds to each of the multiple pieces of the partial code 301-1 to 309-1 for implementing a function of displaying text on the screen in the mainframe code of FIG. 3A, is shown as 1-st colored boxes on the screen image in FIG. 3D. Also, multiple input regions 310-2 to 314-2, each of which corresponds to each of the multiple pieces of the partial code 310-1 to 314-1 for implementing a function of receiving input from the user in the mainframe code of FIG. 3A is shown together as 2-nd colored boxes. Herein, the boxes are for convenience of explanation and may not be seen on the screen image generated during actual implementation of the present disclosure, also, the drawings are in black and white for convenience.

And, text of "(yyyy), (mm), (dd), (dd)" and the region 311-2 for receiving input corresponding to the text, among the input regions 310-2 to 314-2, may be elemental regions for date input, and as another example, the region 320 including the regions 303-2 to 306-2 for displaying text of "Year, Month, Start Day, End Day" may be determined as the elemental region for the date input, and a criterion of determining of the elemental regions may vary as the case may be.

Also, during the learning process, for each of the elemental regions determined as such, (i) category information, e.g., the INPUT category of the elemental region for the date input, corresponding to its meaning and (ii) the true elemental region information including the coordinates information and the elemental region size information on said each of the elemental regions, may be assigned to said each of the elemental regions. Herein, the true elemental region information may be determined by a separate process of labeling and thus labels are assigned, in a form of metadata corresponding to the screen image, to each of the screen images having said each of the elemental regions.

Next, a method of providing the information on the candidate design widgets that can replace each of the determined elemental regions and a method of replacing each of the determined elemental regions during the testing process is described by referring to FIG. 3E as follows.

FIG. 3E is a drawing schematically illustrating an example of displaying the candidate design widgets for selection that can replace the elemental regions in FIG. 3D in accordance with one example embodiment of the present disclosure.

By referring to FIG. 3E, during the testing process, if each of the elemental regions for testing included in the specific screen image for testing is determined, then the information on the candidate design widgets that can replace the elemental regions for testing may be provided, and if the screen image in FIG. 3D is the screen image for testing and its elemental regions are the elemental regions for testing, then information 401 on the candidate design widgets 401-1, 401-2, and 401-3 that can replace the elemental region 311-2 for the date input included in the specific screen image for testing as illustrated in FIG. 3E may be displayed on a specific screen for testing corresponding to the specific screen image for testing or may be provided via another device, for the user. The screen image for testing in FIG. 3E also includes the elemental regions 312-2, 313-2, and 314-2 for receiving "YES" or "NO" in addition to the elemental region 311-2 for the date input, and information 402 on the candidate design widgets 402-1, 402-2, and 402-3 for the replacement may also be provided to the user together or sequentially and how the information on the candidate design widgets is provided may vary as the case may be.

And, if one of the candidate design widgets provided as such is selected by the user, the elemental region may be replaced with the selected one of the candidate design widgets. During the process as such, the replacement may be performed with properties of the candidate design widgets being modified, for example, a size of the selected one of the candidate design widgets may be adjusted to correspond to a size of the elemental region, and a process of the design remodeling testing device 100 adjusting (i) variables in each piece of the specific partial mainframe code for testing corresponding to the elemental region and (ii) variables in the selected one of the candidate design widgets so that the variables correspond to one another by referring to the variables mapping information generated previously may further be performed, as the case may be.

FIG. 4 is a drawing schematically illustrating an example of displaying the candidate design widgets for selection in a development environment to be used for re-hosting text-based design code of the mainframe computer to the open system in accordance with one example embodiment of the present disclosure.

By referring to FIG. 4, in order to re-host the mainframe code to the open system, a development process of migrating the mainframe code to the open system must be performed, and a development tool to remodel the mainframe code for the text-based screen design into the graphic-based screen design may be used as in FIG. 4.

The development tool may show information on the 1-st code for testing which is the mainframe code for testing corresponding to the specific screen image for testing. And the 1-st code may be implemented in the programming language used on the mainframe computer, or may have been converted beforehand into the programming language used in the open system, or a process of providing the mutual compatibility therebetween using the software library may further have been performed. Next, a process of replacing each of the elemental regions for testing on the screen image for testing with at least one of the candidate design widgets may be performed by using the development tool. In detail, (i) the development tool in FIG. 4 shows the elemental regions 511, corresponding to a date input category, and their corresponding partial code 521, and (ii) information 501 on the candidate design widgets 501-1, 501-2, and 501-3 applicable to the elemental regions 511 may be separately displayed for the user's selection. If the user select one of the candidate design widgets, the partial code 521 corresponding to the elemental regions 511 may be replaced with the 2-nd code for testing corresponding to the selected one of the candidate design widgets stored in the database, etc. And, as another example, before the user selects one of the candidate design widgets, even if the 2-nd code for testing corresponding to the preset default design widget among the candidate design widgets has replaced the 1-st code for testing, information on the candidate design widgets may still be provided to the user, as the case may be. Also, as still another example, during the process of the partial code 521 corresponding to the elemental regions 511 being replaced with the 2-nd code for testing corresponding to the selected one of the candidate design widgets stored in the database, a process of adjusting the variables by further referring to the variables mapping information between one or more 1-st variables used in the partial code corresponding to the date input category and one or more 2-nd variables used in the 2-nd code for testing corresponding to the candidate design widgets may further be performed, and the variables mapping information may also be provided to the user as the case may be.

The present disclosure has an effect of efficiently changing the text-based screen design to the graphic-based screen design.

The present disclosure has another effect of providing the learning method and the testing method based on the machine learning by referring to the code for screen design, to thereby accurately determine the elemental regions to be used for remodeling the text-based screen design into the graphic-based screen design, and providing the information on the candidate design widgets that can replace the elemental regions to be remodeled.

The present disclosure has still another effect of providing the learning method and the testing method based on the machine learning by further referring to the image whose regions corresponding to the code for screen design are distinguishable via the colors per each of the categories or per each of the associated meanings of the code for screen design as a result of the code analysis or the natural language processing (NLP) on the code for screen design, to thereby allow accurate determination of the elemental regions in the text-based screen design that can be replaced with graphic-based screen design.

The present disclosure has still yet another effect of providing a method for using the variables mapping information generated beforehand during the process of remodeling the text-based screen design into the graphic-based screen design, to thereby provide the information on the candidate design widgets efficiently.

The embodiments of the present invention as explained above can be implemented in a form of executable program command through a variety of computer means recordable to computer readable media. The computer readable media may include solely or in combination, program commands, data files, and data structures. The program commands recorded to the media may be components specially designed for the present invention or may be usable to a skilled human in a field of computer software. Computer readable media include magnetic media such as hard disk, floppy disk, and magnetic tape, optical media such as CD-ROM and DVD, magneto-optical media such as floptical disk and hardware devices such as ROM, RAM, and flash memory specially designed to store and carry out program commands. Program commands include not only a machine language code made by a complier but also a high level code that can be used by an interpreter etc., which is executed by a computer. The aforementioned hardware device can work as more than a software module to perform the action of the present invention and they can do the same in the opposite case.

As seen above, the present disclosure has been explained by specific matters such as detailed components, limited embodiments, and drawings. They have been provided only to help more general understanding of the present disclosure. It, however, will be understood by those skilled in the art that various changes and modification may be made from the description without departing from the spirit and scope of the disclosure as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A testing method for design remodeling to remodel a text-based screen design into a graphic-based screen design, comprising steps of:
   (a) on a condition that a design remodeling learning device has learned a machine-learning module for training so that one or more parameters of the machine-learning module for training have been applied to a machine-learning module for testing of a design remodeling testing device, the design remodeling testing device performing a process of acquiring each of a 1-st screen image for testing to a k-th screen image for testing from each of a 1-st screen for testing to a k-th screen for testing, respectively, wherein the 1-st screen for testing to the k-th screen for testing are screens resulting from execution of a 1-st code for testing to be remodeled and k is an integer larger than 0;
   (b) the design remodeling testing device performing a process of instructing the machine-learning module for testing to generate each piece of elemental region information for testing including coordinates information for testing, elemental region size information for testing, and category information on each of one or more elemental regions for testing by applying at least one machine-learning operation to the 1-st screen image for testing to the k-th screen image for testing wherein at least part of the elemental regions for testing is included in corresponding each of the 1-st screen image for testing to the k-th screen image for testing; and
   (c) the design remodeling testing device performing (i) a process of retrieving information on one or more candidate design widgets, with which each of the elemental regions for testing is replaced, from a database, by referring to the generated elemental region information for testing wherein the database stores information on the one or more candidate design widgets per each of categories and (ii) a process of providing or supporting another device to provide the information on the one or more candidate design widgets.

2. The method of claim 1, wherein the machine-learning module for training is learned by the design remodeling learning device, and wherein the design remodeling learning device performs (i) on a condition that each piece of true elemental region information has been determined including true coordinates information, true elemental region size information, and true category information on each of one or more elemental regions for training, wherein at least part of the elemental regions for training is included in corresponding each of a 1-st screen image for training to an n-th screen image for training acquired from each of a 1-st screen for training to an n-th screen for training, respectively, and wherein the 1-st screen for training to the n-th screen for training are screens resulting from execution of a 1-st code for training and n is an integer larger than 0, a process of acquiring each of the 1-st screen image for training to the n-th screen image for training, and a process of instructing the machine-learning module for training to apply the machine-learning operation to each of the 1-st screen image for training to the n-th screen image for training, to thereby estimate each piece of elemental region information for training including coordinates information for training, elemental region size information for training, and the category information on each of the elemental regions for training, and (ii) a process of instructing the machine-learning module for training to calculate one or more losses by referring to each piece of the estimated elemental region information for training and its corresponding piece of true elemental region information, and adjusting the parameters of the machine-learning module for training by backpropagating the losses.

3. The method of claim 2, wherein the 1-st code for testing is a mainframe code for testing and the 1-st code for training is a mainframe code for training,
   wherein, during a process of learning the machine-learning module for training, the design remodeling learning device performs a process of instructing the machine-learning module for training to estimate each piece of the elemental region information for training including the coordinates information for training, the elemental region size information for training, and the category information on each of the elemental regions for training by further referring to the mainframe code for training, and
   wherein the design remodeling testing device performs a process of instructing the machine-learning module for testing to output each piece of the elemental region information for testing including the coordinates information for testing, the elemental region size information for testing, and the category information on each of the elemental regions for testing by further referring to the mainframe code for testing.

4. The method of claim 3, wherein information on the one or more candidate design widgets stored in the database further includes information on each piece of a 2-nd code for testing corresponding to each of the one or more candidate design widgets, and
   wherein the method further comprises a step of: (d) if selection information is acquired representing that a developer selects one of the one or more candidate design widgets provided for a specific elemental region for testing among the elemental regions for testing, the design remodeling testing device performing a process of replacing (i) each piece of specific partial mainframe code for testing, corresponding to the specific elemental region for testing, among the mainframe code for testing with (ii) the 2-nd code for testing corresponding to the selected one of the one or more candidate design widgets.

5. The method of claim 4, wherein, on a condition that variables mapping information on at least part of mapping relation of one or more variables between the mainframe code for testing and the 2-nd code for testing corresponding to the one or more candidate design widgets has been generated beforehand by referring to 1-st variable information on each of one or more variables used in the mainframe code for testing and 2-nd variable information on each of one or more variables used in each of the one or more candidate design widgets, the design remodeling testing device performs a process of replacing (i) each piece of specific partial mainframe code for testing, corresponding to the specific elemental region for testing, among the mainframe code for testing with (ii) the 2-nd code for testing corresponding to the selected one of the one or more candidate design widgets, by further referring to the variables mapping information.

6. The method of claim 3, wherein, on a condition that (i) prior analysis of the mainframe code for training has been completed, (ii) each of at least one piece of partial mainframe code for training per each of the categories, corresponding to each of functions to be implemented on a screen if its corresponding piece of the mainframe code for training is executed, has been classified as a result of the prior analysis, and (iii) at least one code-function image for training has been further generated beforehand by distinguishing one or more regions, corresponding to each classified piece of the partial mainframe code for training per each of the categories, by each of colors per each of the categories for each of the 1-st screen image for training to the n-th screen image for training, the design remodeling learning device performs a process of instructing the machine-learning module for training to estimate each piece of the elemental region information for training by further referring to the code-function image for training, and wherein, on a condition that (i) preceding analysis of the mainframe code for testing has been completed, (ii) each of at least one piece of partial mainframe code for testing per each of the categories, corresponding to each of functions to be implemented on a screen if its corresponding piece of the mainframe code for testing is executed, has been classified as a result of the preceding analysis, and (iii) at least one code-function image for testing has been further generated beforehand by distinguishing one or more regions, corresponding to each classified piece of the partial mainframe code for testing per each of the categories, by each of the colors per each of the categories for each of the 1-st screen image for testing to the k-th screen image for testing, the design remodeling testing device performs a process of instructing the machine-learning module for testing to output each piece of the elemental region information for testing by further referring to the code-function image for testing.

7. The method of claim 3, wherein, on a condition that (i) natural language processing (NLP) has been performed on the mainframe code for training, (ii) each piece of partial mainframe code for training per each associated meaning has been identified, which has its corresponding associated meaning, among the mainframe code for training as a result of the NLP, and (iii) at least one NLP image for training has been further generated beforehand by distinguishing one or more regions, corresponding to each classified piece of the partial mainframe code for training per each of the associated meanings, by each of the colors per each of the associated meanings for each of the 1-st screen image for training to the n-th screen image for training, the design remodeling learning device performs a process of instructing the machine-learning module for training to estimate each piece of the elemental region information for training by further referring to the NLP image for training, wherein, on a condition that (i) the NLP has been performed on the mainframe code for testing, (ii) each piece of partial mainframe code for testing per each of the associated meanings has been identified, which has its corresponding associated meaning, among the mainframe code for testing as a result of the NLP, and (iii) at least one NLP image for testing has been further generated beforehand by distinguishing one or more regions, corresponding to each classified piece of the partial mainframe code for testing per each of the associated meanings, by each of the colors per each of the associated meanings for each of the 1-st screen image for testing to the k-th screen image for testing, the design remodeling testing device performs a process of instructing the machine-learning module for testing to output each piece of the elemental region information for testing by further referring to the NLP image for testing.

8. The method of claim 3, wherein the design remodeling learning device performs a process of instructing the machine-learning module for training to estimate each of probabilities of each piece of the elemental region information for training for each of the 1-st screen image for training to the n-th screen image for training belonging to each of the categories, and wherein the design remodeling testing device performs a process of instructing the machine-learning module for testing to output each of probabilities of each piece of the elemental region information for testing for each of the 1-st screen image for testing to the k-th screen image for testing belonging to each of the categories.

9. The method of claim 8, wherein the design remodeling learning device performs a process of determining each specific category corresponding to each highest probability among each of the probabilities of each of the elemental regions for training as each of the categories of each of the elemental regions for training, and wherein the design remodeling testing device performs a process of determining each specific category corresponding to each highest probability among each of the probabilities of each of the categories for each piece of the elemental regions for testing as each of the categories of each of the elemental regions for testing.

10. The method of claim 8, wherein each of the elemental regions for training is classified into sub-categories, wherein the true category information included in the true elemental region information has each of the sub-categories corresponding to each of the elemental regions for training, wherein, during the process of learning the machine-learning module for training, the design remodeling learning device instructs the machine-learning module for training to estimate each of the probabilities of each of the elemental regions for training belonging to each of the sub-categories, wherein the category information corresponding to each of the elemental regions for testing is classified into the sub-categories, and wherein the design remodeling testing device performs a process of instructing the machine-learning module for testing to output each of probabilities of each of the elemental regions for testing belonging to each of the sub-categories.

11. A design remodeling testing device for design remodeling to remodel a text-based screen design into a graphic-based screen design, comprising:

at least one memory that stores instructions; and at least one processor configured to execute the instructions to perform or support another device to perform: (I) on a condition that a design remodeling learning device has learned a machine-learning module for training so that one or more parameters of the machine-learning module for training have been applied to a machine-learning module for testing of the design remodeling testing device, a process of acquiring each of a 1-st screen image for testing to a k-th screen image for testing from each of a 1-st screen for testing to a k-th screen for testing, respectively, wherein the 1-st screen for testing to the k-th screen for testing are screens resulting from execution of a 1-st code for testing to be remodeled and k is an integer larger than 0, (II) a process of instructing the machine-learning module for testing to generate each piece of elemental region information for testing including coordinates information for testing, elemental region size information for testing, and category information on each of one or more elemental regions for testing by applying at least one machine-learning operation to the 1-st screen image for testing to the k-th screen image for testing wherein at least part of the elemental regions for testing is included in corresponding each of the 1-st screen image for testing to the k-th screen image for testing, and (III) (III-1) a process of retrieving information on one or more candidate design widgets, with which each of the elemental regions for testing is replaced, from a database, by referring to the generated elemental region information for testing wherein the database stores information on the one or more candidate design widgets per each of categories and (III-2) a process of providing or supporting another device to provide the information on the one or more candidate design widgets.

12. The design remodeling testing device of claim 11, wherein the machine-learning module for training is learned by the design remodeling learning device, and wherein the design remodeling learning device performs (i) on a condition that each piece of true elemental region information has been determined including true coordinates information, true elemental region size information, and true category information on each of one or more elemental regions for training, wherein at least part of the elemental regions for training is included in corresponding each of a 1-st screen image for training to an n-th screen image for training acquired from each of a 1-st screen for training to an n-th screen for training, respectively, and wherein the 1-st screen for training to the n-th screen for training are screens resulting from execution of a 1-st code for training and n is an integer larger than 0, a process of acquiring each of the 1-st screen image for training to the n-th screen image for training, and a process of instructing the machine-learning module for training to apply the machine-learning operation to each of the 1-st screen image for training to the n-th screen image for training, to thereby estimate each piece of elemental region information for training including coordinates information for training, elemental region size information for training, and the category information on each of the elemental regions for training, and (ii) a process of instructing the machine-learning module for training to calculate one or more losses by referring to each piece of the estimated elemental region information for training and its corresponding piece of true elemental region information, and adjusting the parameters of the machine-learning module for training by backpropagating the losses.

13. The design remodeling testing device of claim 12, wherein the 1-st code for testing is a mainframe code for testing and the 1-st code for training is a mainframe code for training,
wherein, during a process of learning the machine-learning module for training, the design remodeling learning device performs a process of instructing the machine-learning module for training to estimate each piece of the elemental region information for training including the coordinates information for training, the elemental region size information for training, and the category information on each of the elemental regions for training by further referring to the mainframe code for training, and
wherein the processor performs a process of instructing the machine-learning module for testing to output each piece of the elemental region information for testing including the coordinates information for testing, the elemental region size information for testing, and the category information on each of the elemental regions for testing by further referring to the mainframe code for testing.

14. The design remodeling testing device of claim 13, wherein information on the one or more candidate design widgets stored in the database further includes information on each piece of a 2-nd code for testing corresponding to each of the one or more candidate design widgets, and
wherein the processor further performs: (IV) if selection information is acquired representing that a developer selects one of the one or more candidate design widgets provided for a specific elemental region for testing among the elemental regions for testing, a process of replacing (i) each piece of specific partial mainframe code for testing, corresponding to the specific elemental region for testing, among the mainframe code for testing with (ii) the 2-nd code for testing corresponding to the selected one of the one or more candidate design widgets.

15. The design remodeling testing device of claim 14, wherein, on a condition that variables mapping information on at least part of mapping relation of one or more variables between the mainframe code for testing and the 2-nd code for testing corresponding to the one or more candidate design widgets has been generated beforehand by referring to 1-st variable information on each of one or more variables used in the mainframe code for testing and 2-nd variable information on each of one or more variables used in each of the one or more candidate design widgets, the processor performs a process of replacing (i) each piece of specific partial mainframe code for testing, corresponding to the specific elemental region for testing, among the mainframe code for testing with (ii) the 2-nd code for testing corresponding to the selected one of the one or more candidate design widgets, by further referring to the variables mapping information.

16. The design remodeling testing device of claim 13, wherein, on a condition that (i) prior analysis of the mainframe code for training has been completed, (ii) each of at least one piece of partial mainframe code for training per each of the categories, corresponding to each of functions to be implemented on a screen if its corresponding piece of the mainframe code for training is executed, has been classified as a result of the prior analysis, and (iii) at least one code-function image for training has been further generated beforehand by distinguishing one or more regions, corresponding to each classified piece of the partial mainframe code for training per each of the categories, by each of colors per each of the categories for each of the 1-st screen image for training to the n-th screen image for training, the design remodeling learning device performs a process of instructing the machine-learning module for training to estimate each piece of the elemental region information for training by further referring to the code-function image for training, and
wherein, on a condition that (i) preceding analysis of the mainframe code for testing has been completed, (ii) each of at least one piece of partial mainframe code for testing per each of the categories, corresponding to each of functions to be implemented on a screen if its corresponding piece of the mainframe code for testing is executed, has been classified as a result of the preceding analysis, and (iii) at least one code-function image for testing has been further generated beforehand by distinguishing one or more regions, corresponding to each classified piece of the partial mainframe code for testing per each of the categories, by each of the colors per each of the categories for each of the 1-st screen image for testing to the k-th screen image for testing, the processor performs a process of instructing the machine-learning module for testing to output each piece of the elemental region information for testing by further referring to the code-function image for testing.

17. The design remodeling testing device of claim 13, wherein, on a condition that (i) natural language processing (NLP) has been performed on the mainframe code for training, (ii) each piece of partial mainframe code for training per each associated meaning has been identified, which has its corresponding associated meaning, among the mainframe code for training as a result of the NLP, and (iii) at least one NLP image for training has been further generated beforehand by distinguishing one or more regions, corresponding to each classified piece of the partial mainframe code for training per each of the associated meanings, by each of the colors per each of the associated meanings for each of the 1-st screen image for training to the n-th screen image for training, the design remodeling learning device performs a process of instructing the machine-learning module for training to estimate each piece of the elemental region information for training by further referring to the NLP image for training, wherein, on a condition that (i) the NLP has been performed on the mainframe code for testing, (ii) each piece of partial mainframe code for testing per each of the associated meanings has been identified, which has its corresponding associated meaning, among the mainframe code for testing as a result of the NLP, and (iii) at least one NLP image for testing has been further generated beforehand by distinguishing one or more regions, corresponding to each classified piece of the partial mainframe code for testing per each of the associated meanings, by each of the colors per each of the associated meanings for each of the 1-st screen image for testing to the k-th screen image for testing, the processor performs a process of instructing the machine-learning module for testing to output each piece of the elemental region information for testing by further referring to the NLP image for testing.

18. The design remodeling testing device of claim 13, wherein the design remodeling learning device performs a process of instructing the machine-learning module for training to estimate each of probabilities of each piece of the elemental region information for training for each of the 1-st screen image for training to the n-th screen image for training belonging to each of the categories, and wherein the processor performs a process of instructing the machine-learning module for testing to output each of probabilities of each piece of the elemental region information for testing for each of the 1-st screen image for testing to the k-th screen image for testing belonging to each of the categories.

19. The design remodeling testing device of claim 18, wherein the design remodeling learning device performs a process of determining each specific category corresponding to each highest probability among each of the probabilities of each of the elemental regions for training as each of the categories of each of the elemental regions for training, and wherein the processor performs a process of determining each specific category corresponding to each highest probability among each of the probabilities of each of the categories for each piece of the elemental regions for testing as each of the categories of each of the elemental regions for testing.

20. The design remodeling testing device of claim 18, wherein each of the elemental regions for training is classified into sub-categories, wherein the true category information included in the true elemental region information has each of the sub-categories corresponding to each of the elemental regions for training, wherein, during the process of learning the machine-learning module for training, the design remodeling learning device instructs the machine-learning module for training to estimate each of the probabilities of each of the elemental regions for training belonging to each of the sub-categories, wherein the category information corresponding to each of the elemental regions for testing is classified into the sub-categories, and wherein the processor performs a process of instructing the machine-learning module for testing to output each of probabilities of each of the elemental regions for testing belonging to each of the sub-categories.

* * * * *